United States Patent
Jang et al.

(10) Patent No.: US 11,614,663 B2
(45) Date of Patent: Mar. 28, 2023

(54) DISPLAY DEVICE AND MANUFACTURING METHOD THEREOF

(71) Applicant: Samsung Display Co., LTD., Yongin-si (KR)

(72) Inventors: Jingwan Jang, Osan-si (KR); Ho Sup Choi, Seoul (KR); Sungwoo Lee, Gunpo-si (KR); Kyung-Hwa Lim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 72 days.

(21) Appl. No.: 17/161,953

(22) Filed: Jan. 29, 2021

(65) Prior Publication Data

US 2021/0263367 A1    Aug. 26, 2021

(30) Foreign Application Priority Data

Feb. 24, 2020    (KR) .................. 10-2020-0022000

(51) Int. Cl.

| | | |
|---|---|---|
| *G02F 1/1345* | (2006.01) | |
| *G02F 1/1362* | (2006.01) | |
| *H05K 1/18* | (2006.01) | |
| *H05K 3/32* | (2006.01) | |
| *G02F 1/1368* | (2006.01) | |

(52) U.S. Cl.
CPC ...... *G02F 1/13452* (2013.01); *G02F 1/13458* (2013.01); *G02F 1/136286* (2013.01); *G02F 1/1368* (2013.01); *H05K 1/189* (2013.01); *H05K 3/323* (2013.01); *H05K 2201/10136* (2013.01)

(58) Field of Classification Search
CPC ............ G02F 1/13452; G02F 1/13458; G02F 1/136286
See application file for complete search history.

(56) References Cited

U.S. PATENT DOCUMENTS

| | | | |
|---|---|---|---|
| 6,111,627 A | 8/2000 | Kim et al. | |
| 10,090,334 B2 | 10/2018 | Bae et al. | |
| 2013/0342476 A1 | 12/2013 | Lee et al. | |
| 2018/0061367 A1* | 3/2018 | Ye | G09G 5/10 |
| 2021/0200006 A1* | 7/2021 | Ryu | H05K 1/118 |

FOREIGN PATENT DOCUMENTS

| | | |
|---|---|---|
| KR | 10-0375732 A | 2/2003 |
| KR | 1020130127164 A | 11/2013 |
| KR | 1020140000084 A | 1/2014 |
| KR | 1020170139211 A | 12/2017 |
| WO | WO 2020036277 A1 * | 2/2020 |

* cited by examiner

*Primary Examiner* — Dung T Nguyen
(74) *Attorney, Agent, or Firm* — Cantor Colburn LLP

(57) ABSTRACT

A display device includes a first substrate, a second substrate facing the first substrate, and a sealing layer respectively including first, second and third side surfaces coplanar with each other; a first recess defined recessed from each of the first side surface, the second side surface and the third side surface; a first conductive pattern in the first recess; and a first driver facing each of the first side surface, the second side surface and the third side surface. At the first recess: the first conductive pattern is exposed to outside the first substrate, the second substrate and the sealing layer, and the first driver is electrically connected to the first conductive pattern.

19 Claims, 16 Drawing Sheets

DISPLAY DEVICE AND MANUFACTURING METHOD THEREOF

This application claims priority to Korean Patent Application No. 10-2020-0022000, filed on Feb. 24, 2020, and all the benefits accruing therefrom under 35 U.S.C. § 119, the entire contents of which are hereby incorporated by reference.

BACKGROUND

(1) Field

The present disclosure herein relates to a display device and a manufacturing method thereof.

(2) Description of the Related Art

A display device includes a display panel including a plurality of pixels for displaying an image, a gate driver for providing gate signals to the pixels, and a data driver for providing data voltages to the pixels. The gate driver and the data driver are connected to the display panel.

The gate driver generates gate signals and provides the generated gate signals to the pixels. The data driver generates data voltages and provides the generated data voltages to the pixels. The pixels receive the data voltages and display an image in response to the gate signals.

SUMMARY

One or more embodiment provides a display device which increases a contact area between conductive layers and signal lines of a display panel and minimizes external exposure of the conductive layers to outside the display panel, and a manufacturing method thereof.

An embodiment provides a display device including: a first substrate including a first substrate including a first side surface; a second substrate facing the first substrate and including a second side surface coplanar with the first side surface; a sealing layer between the first substrate and the second substrate and extending along an edge of each of the first substrate and the second substrate, the sealing layer including a third side surface coplanar with the second side surface; a first recess defined recessed from each of the first side surface, the second side surface and the third side surface; a first conductive pattern in the first recess; and a first driver facing each of the first side surface, the second side surface and the third side surface. At the first recess: the first conductive pattern is exposed to outside the first substrate, the second substrate and the sealing layer, and the first driver is electrically connected to the first conductive pattern.

In an embodiment, a method for manufacturing a display device includes: providing a display panel including: a first substrate including a first side surface, a second substrate facing the first substrate and including a second side surface coplanar with the first side surface, and a sealing layer which extends along an edge of each of the first substrate and the second substrate, the sealing layer including a third side surface coplanar with the second side surface; providing a first recess defined recessed from each of the first side surface, the second side surface and the third side surface; providing a first conductive pattern in the first recess; providing a first driver facing each of the first side surface, the second side surface and the third side surface; and providing the first driver which faces each of the first side surface, the second side surface and the third side surface, electrically connected to the first conductive pattern.

BRIEF DESCRIPTION OF THE DRAWINGS

The accompanying drawings are included to provide a further understanding of the invention, and are incorporated in and constitute a part of this specification. The drawings illustrate embodiments and, together with the description, serve to explain principles of the invention. In the drawings.

DETAILED DESCRIPTION

Figure 1:
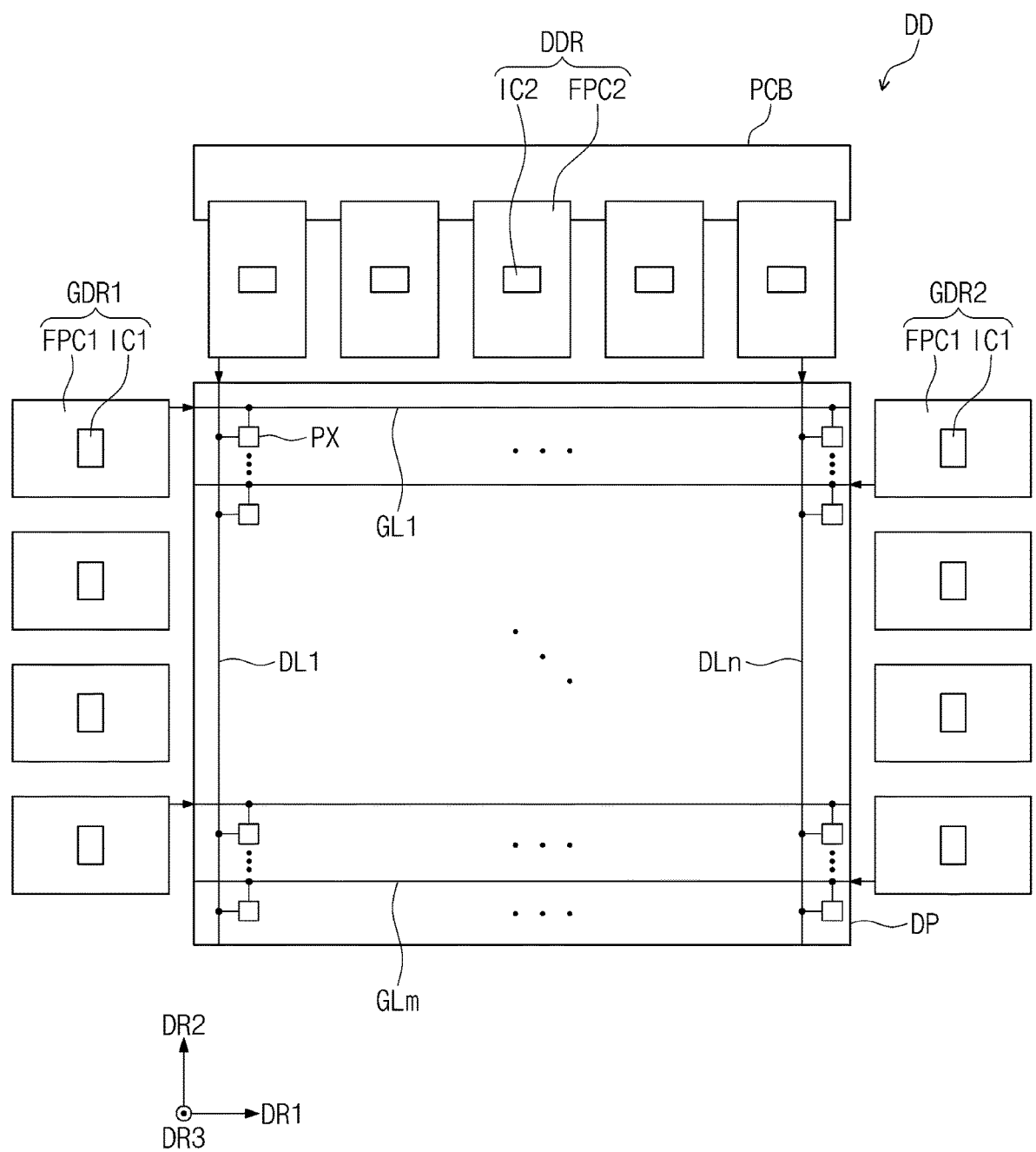
FIG. 1 is a top plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or region, layer, portion) is referred to as being related to another component such as being 'on,' 'connected to' or 'coupled to' another component, it can be directly disposed/connected/coupled on/to the one component, or an intervening third component may also be present. In contrast, when one component (or region, layer, portion) is referred to as being related to another component such as being 'directly on,' 'directly connected to' or 'directly coupled to' another component, an intervening third component is not present therebetween.

Like reference numerals refer to like elements throughout. Also, in the figures, the thickness, ratio, and dimensions of components are exaggerated for clarity of illustration.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims.

The terms of a singular form may include plural forms unless referred to the contrary. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated listed items.

Also, "under," "below," "above," "upper" and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An area of a display device in which a driver such as a gate driver or a data driver DDR is disposed, is defined as a bezel area. A technology of connecting the gate driver and the data driver DDR to a side surface of the display panel DP has been developed in order to reduce dimensions of the bezel area.

Hereinafter, embodiments will be described in detail with reference to the accompanying drawings.

FIG. 1 is a top plan view illustrating an embodiment of a display device DD.

Referring to FIG. 1, a display device DD includes a display panel DP, a first gate driver GDR1 and a second gate driver GDR2 (e.g., gate drivers GDR1 and GDR2), a data driver DDR, and a circuit board such as a printed circuit board PCB. The display panel DP may have a rectangular shape having long sides each extending along a first direction DR1 and short sides each extending along a second direction DR2 which crosses the first direction DR1. However, the shape of the display panel DP is not limited thereto.

Hereinafter, a direction that crosses a plane defined by the first direction DR1 and the second direction DR2, is defined as a third direction DR3. The third direction DR3 may cross the plane in a substantially perpendicular manner, without being limited thereto. The third direction DR3 may define a thickness direction of the display device DD and various components thereof. Also, in this specification, an expression of "when viewed from a plane" or "in a plan view" may represent a view along the third direction DR3.

The display panel DP may be a liquid crystal display panel including a liquid crystal layer LC, but is not limited thereto. In an embodiment, for example, the display panel DP may be an electrophoretic display panel including an electrophoretic layer or an electrowetting display panel including an electrowetting layer. Each of the liquid crystal layer LC, the electrophoretic layer, and the electrowetting layer may be defined as an image display layer.

The display panel DP may include a pixel PX provided in plural (e.g., a plurality of pixels PX), a plurality of gate lines GL1 to GLm as signal lines, and a plurality of data lines DL1 to DLn as signal lines. Here, reference numerals 'm' and 'n' are natural numbers. The gate lines GL1 to GLm and the data lines DL1 to DLn may extend to cross each other in an insulating manner.

The pixels PX are connected to the gate lines GL1 to GLm and the data lines DL1 to DLn. Each of the pixels PX may display one primary color among primary colors. The primary colors may include red, green, blue and white, but are not limited thereto. In an embodiment, for example, the primary colors may further include various colors such as yellow, cyan and magenta.

The gate lines GL1 to GLm each may extend along the first direction DR1, and the data lines DL1 to DLn each may extend along the second direction DR2. The gate drivers GDR1 and GDR2 may be connected to the display panel DP, and particularly connected to the gate lines GL1 to GLm of the display panel DP. The data driver DDR may be connected to the display panel DP, and particularly connected to the data lines DL1 to DLn of the display panel DP.

The gate drivers GDR1 and GDR2 and the data driver DDR are exemplarily separated from the display panel DP (e.g., external to the display panel DP) in order to illustrate a plan view of the gate drivers GDR1 and GDR2 and the data driver DDR. A configuration in which the gate drivers GDR1 and GDR2 and the data driver DDR are connected to the display panel DP will be described below in detail.

The gate drivers GDR1 and GDR2 may include the first gate driver GDR1 and the second gate driver GDR2 disposed at respective sides among opposing sides of the display panel DP which are opposite to each other along the first direction DR1. The first and second gate drivers GDR1 and GDR2 may be adjacent to the short sides of the display panel DP, respectively.

The first gate driver GDR1 may be connected to odd-numbered gate lines among the gate lines GL1 to GLm. The second gate driver GDR2 may be connected to even-numbered gate lines among the gate lines GL1 to GLm.

Although two gate drivers GDR1 and GDR2 are illustrated, the number of gate drivers is not limited thereto. In an embodiment, for example, one gate driver may be disposed at one side of the display panel DP and connected to the gate lines GL1 to GLm.

Each of the first and second gate drivers GDR1 and GDR2 may include a first flexible circuit board FPC1 (e.g., first circuit board or gate circuit board) provided in plural (e.g., a plurality of first flexible circuit boards FPC1) and a first driving chip IC1 (e.g., gate driving chip) provided in plural (e.g., a plurality of first driving chips IC1) which are mounted to the first flexible circuit boards FPC1, respectively. The first driving chips IC1 may be connected to the display panel DP through the first flexible circuit boards FPC1.

The first driving chips IC1 of the first gate driver GDR1 may be connected to the odd-numbered gate lines through the first flexible circuit boards FPC1 of the first gate driver GDR1. The first driving chips IC1 of the second gate driver GDR2 may be connected to the even-numbered gate lines through the first flexible circuit boards FPC1 of the second gate driver GDR2.

FIG. 1 exemplarily illustrates four of the first driving chips IC1 and four of the first flexible circuit boards FPC1 within each of the first and second gate drivers GDR1 and GDR2, however, the number of each of the first driving chips IC1 and the first flexible circuit boards FPC1 is not limited thereto.

The data driver DDR may be disposed at a side of the display panel DP which meets the sides at which the first and second gate drivers GDR1 and GDR2 are disposed. The side may be one of opposing sides of the display panel DP which are opposite to each other along the second direction DR2. The data driver DDR may be disposed adjacent to one of the long sides of the display panel DP.

The data driver DDR may include a second flexible circuit board FPC2 (e.g., second circuit board or data circuit board) provided in plural (e.g., a plurality of second flexible circuit boards FPC2) and a second driving chip IC2 (e.g., data driving chip) provided in plural (e.g., a plurality of second driving chips IC2) mounted to the second flexible circuit boards FPC2, respectively. The second driving chips IC2 may be connected to the display panel DP through the second flexible circuit boards FPC2.

FIG. 1 exemplarily illustrates five of the second driving chips IC2 and five of the second flexible circuit boards FPC2, however, the number of each of the second driving chips IC2 and the second flexible circuit boards FPC2 is not limited thereto.

The second flexible circuit boards FPC2 may be connected to the printed circuit board PCB (e.g., third circuit board). The second driving chips IC2 may be connected to the printed circuit board PCB through the second flexible circuit boards FPC2.

A timing controller (not shown) may be disposed on the printed circuit board PCB. The timing controller may be mounted on the printed circuit board PCB in the form of an integrated circuit chip. The timing controller may be connected to the first and second gate drivers GDR1 and GDR2 and the data driver DDR. The timing controller may output an electrical signal such as a gate control signal, a data control signal and image data. The printed circuit board PCB may provide an electrical signal from outside the display panel DP.

The first and second gate drivers GDR1 and GDR2 may receive the gate control signal from the timing controller and generate a plurality of gate signals as electrical signals, in response to the gate control signal. The gate control signal may be provided to the first and second gate drivers GDR1 and GDR2 through a portion of the second flexible circuit boards FPC2 and the display panel DP. The gate signals may be sequentially outputted. The gate signals may be provided to the pixels PX through the gate lines GL1 to GLm.

The data driver DDR receives the image data and the data control signal from the timing controller. The data driver DDR may generate and output analog-type data voltages as electrical signals corresponding to the image data, in response to the data control signal. The data voltages may be provided to the pixels PX through the data lines DL1 to DLn.

The pixels PX may receive the data voltages through the data lines DL1 to DLn, in response to the gate signals provided through the gate lines GL1 to GLm. The pixels PX may emit and/or display a gradation corresponding to the data voltages, to display an image.

Figure 2:
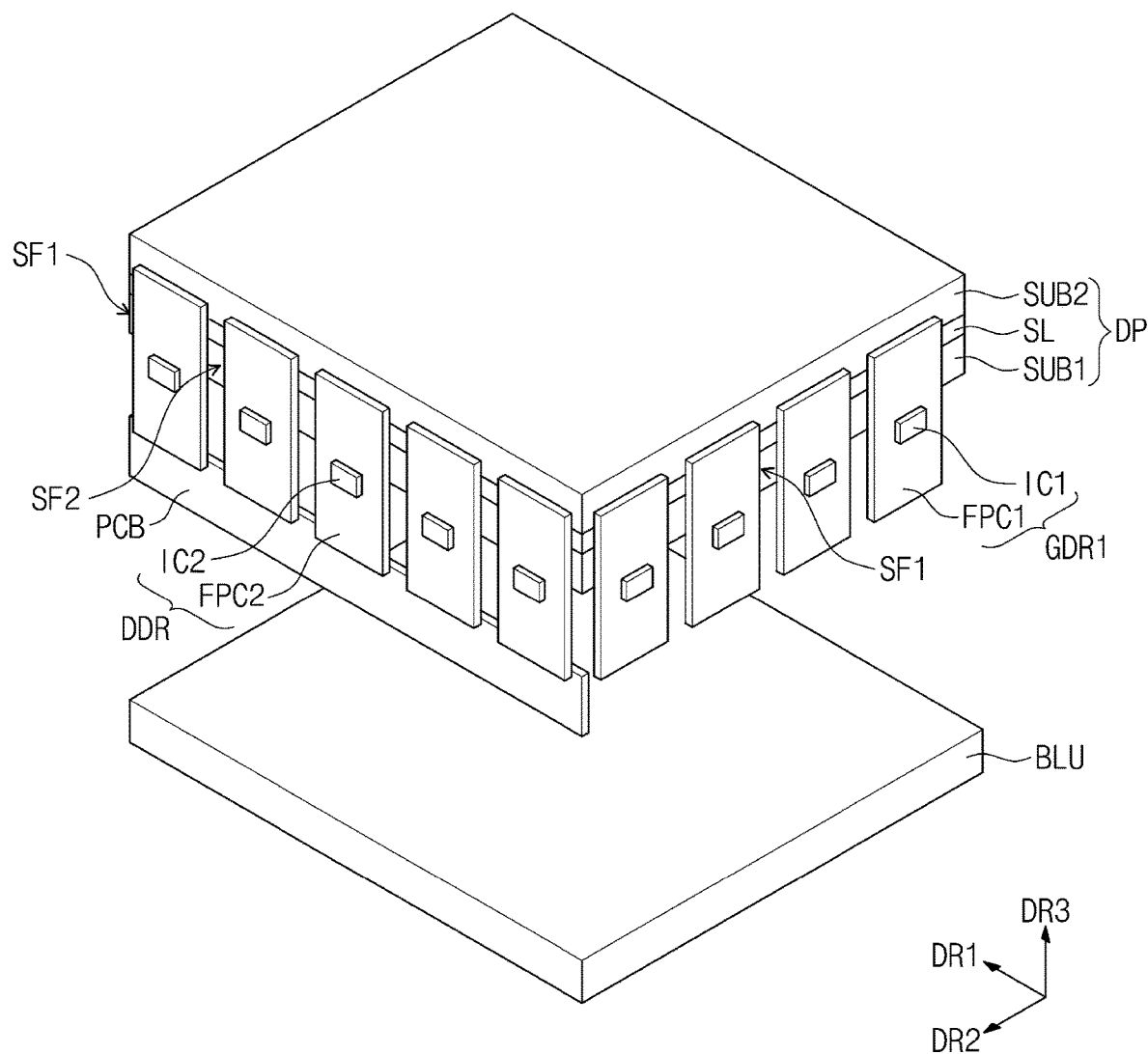
FIG. 2 is a perspective view illustrating an embodiment of the display device in FIG. 1.

FIG. 2 is a perspective view illustrating an embodiment of the display device DD in FIG. 1.

Referring to FIG. 2, the display panel DP may include a first substrate SUB1, a second substrate SUB2, and an encapsulation layer SL (e.g., sealing layer or sealant) disposed between the first substrate SUB1 and the second substrate SUB2. That is, the first substrate SUB1 faces the second substrate SUB2 with the encapsulation layer SL therebetween. Outer side surfaces of the first substrate SUB1, the second substrate SUB2 and the encapsulation layer SL at a same side of the display panel DP, may together define a corresponding outer side surface of the display panel DP. The outer side surfaces of the first substrate SUB1, the second substrate SUB2 and the encapsulation layer SL at a same side of the display panel DP may be coplanar with each other to define a corresponding outer side surface of the display panel DP. The display panel DP may include first outer side surfaces (e.g., first and second side surfaces) opposite to each other along the first direction DR1, and second outer side surfaces (e.g., third and fourth side surfaces) opposite to each other along the second direction DR2.

Each of the first substrate SUB1 and the second substrate SUB2 may have a rectangular shape having long sides each extending along the first direction DR1 and short sides each extending along the second direction DR2. The encapsulation layer SL may extend along an edge (e.g., outer edge) of each of the first substrate SUB1 and the second substrate SUB2, to attach the first substrate SUB1 and the second substrate SUB2 to each other.

The display device DD may include a backlight unit BLU disposed below the display panel DP. The backlight unit BLU may generate and emit light and provide the generated light to the display panel DP. The pixels PX of the display panel DP may display an image by using the light provided from the backlight unit BLU.

The first and second gate drivers GDR1 and GDR2 may be disposed on side surfaces of the display panel DP. In an embodiment, for example, the first and second gate drivers GDR1 and GDR2 may be disposed facing side surfaces of the display panel DP, which are opposite to each other along the first direction DR1, respectively, and connected to the opposing side surfaces of the display panel DP. Although only the first gate driver GDR1 which is disposed on one outer side surface of the display panel DP is illustrated in the perspective view of FIG. 2, the second gate driver GDR2 may be disposed on another outer side surface of the display panel DP opposite to the one outer side surface along the first direction DR1.

The data driver DDR may be disposed on still another outer side surface of the display panel DP, different from the outer side surfaces described above. In an embodiment, for example, the data driver DDR may be disposed on one outer side surface of the display panel DP among outer side surfaces which are opposite to each other along the second direction DR2, and connected to the outer side surface of the display panel DP.

Hereinafter, both of the outer side surfaces of the first substrate SUB1, which the first and second gate drivers GDR1 and GDR2 are disposed facing, are defined as a first side surface SF1 (e.g., first outer side surfaces). The first side surfaces SF1 may be defined by the short sides of the first substrate SUB1. The first side surfaces SF1 each may extend along the second direction DR2.

The side surface of the first substrate SUB1, which the data driver DDR is disposed facing, is defined as a second side surface SF2 (e.g., second outer side surface). The second side surface SF2 may be defined by one of the long sides of the first substrate SUB1. The second side surface SF2 may extend along the first direction DR1.

The first and second gate drivers GDR1 and GDR2 may be connected to the first side surfaces SF1 of the first substrate SUB1, corresponding to side surfaces of the encapsulation layer SL which are disposed in a same plane as (e.g., coplanar with) the first side surfaces SF1, and corresponding to side surfaces of the second substrate SUB2 which are disposed in the same plane as the first side surfaces SF1. The data driver DDR may be connected to the second side surface SF2, a corresponding side surface of the encapsulation layer SL which is disposed in a same plane as the second side surface SF2, and a corresponding side surface of the second substrate SUB2 which is disposed in the same plane as the second side surface SF2.

The first and second gate drivers GDR1 and GDR2 may be electrically connected to the gate lines GL1 to GLm of which ends thereof are disposed at the first side surfaces SF1. The data driver DDR may be electrically connected to the data lines DL1 to DLn of which ends thereof are disposed at the second side surface SF2. The above-described configuration will be described below in detail.

Figure 3:
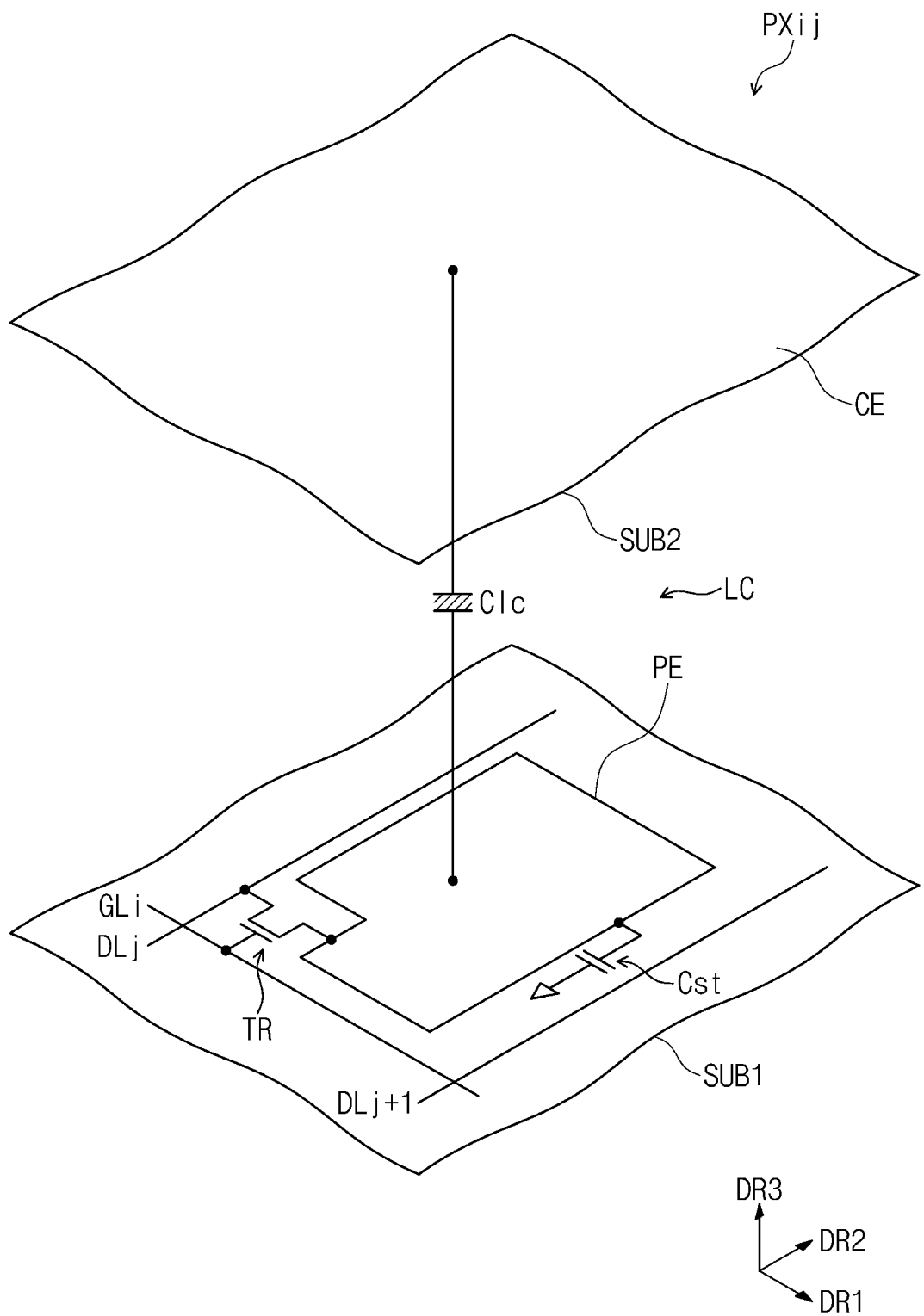
FIG. 3 is a view illustrating an embodiment of a pixel in FIG. 1.

FIG. 3 is a view illustrating an embodiment one of the pixel PX in FIG. 1.

A pixel PXij among the pixels PX is connected to a gate line GLi among the gate lines GL1 to GLm and a data line DLj among the data lines DL1 to DLn is illustrated in FIG. 3. Each of the pixels PX of the display panel DP may have a same configuration as the pixel PXij in FIG. 3, with respect to corresponding ones of the gate lines GL1 to GLm and the data lines DL1 to DLn.

Referring to FIG. 3, the first substrate SUB1 may include the gate line GLi, the data line DLj, and the pixel PXij connected to the gate line GLi and the data line DLj. Specifically, the pixel PXij may include a transistor TR connected to the gate line GLi and the data line DLj, a first capacitor such as a liquid crystal capacitor Clc connected to the transistor TR, and a second capacitor such as a storage capacitor Cst parallel-connected to the liquid crystal capacitor Clc. In an embodiment, the storage capacitor Cst may be omitted. Also, reference numerals 'i' and 'j' are natural numbers.

The transistor TR may include a gate electrode GE connected to the gate line GLi, a source electrode SE connected to the data line DLj, and a drain electrode DE connected to the liquid crystal capacitor Clc and the storage capacitor Cst.

The liquid crystal capacitor Clc may include a pixel electrode PE of the first substrate SUB1 and connected to the transistor TR, a common electrode CE of the second substrate SUB2, and a liquid crystal layer LC disposed between the pixel electrode PE and the common electrode CE. The liquid crystal layer LC may serve as a dielectric material.

Although the pixel electrode PE has a non-slit structure in FIG. 3, the structure is not limited thereto. In an embodiment, for example, the pixel electrode PE may have a slit structure including a stem part having a cross shape, and a plurality of branch parts radially extending from the stem part. The common electrode CE may be disposed over the entirety of the second substrate SUB2, such as to correspond to more than one of the pixel PX.

The storage capacitor Cst may include the pixel electrode PE, a storage electrode (not shown) branched from a storage line (not shown), and an insulation layer disposed between the pixel electrode PE and the storage electrode. The storage line may be disposed in the first substrate SUB1 and simultaneously provided in a same layer as the gate lines GL1 to GLm. The storage electrode may partially overlap the pixel electrode PE along the third direction DR3. As being "in a same layer," elements or features may be respective portions of a same material layer, without being limited thereto.

The pixel PXij may further include a color filter CF having one color among red, green and blue colors. The color filter CF will be illustrated in FIG. 4 below.

The transistor TR may be turned-on in response to a gate signal provided through the gate line GLi. A data voltage received through the data line DLj may be provided to the pixel electrode PE of the liquid crystal capacitor Clc through the turned-on transistor TR. A common voltage may be applied to the common electrode CE.

An electric field may be provided between the pixel electrode PE and the common electrode CE due to a difference between voltage levels of the data voltage and the common voltage. Liquid crystal molecules of the liquid crystal layer LC may be driven by the electric field provided between the pixel electrode PE and the common electrode CE. As a light transmittance is adjusted by the liquid crystal molecules driven by the electric field, an image may be displayed.

A storage voltage having a predetermined voltage level may be applied to the storage line, however, is not limited thereto. In an embodiment, for example, the common voltage may be applied to the storage line. The storage capacitor Cst may serve to supplement an amount of electrical charge in the liquid crystal capacitor Clc.

Figure 4:
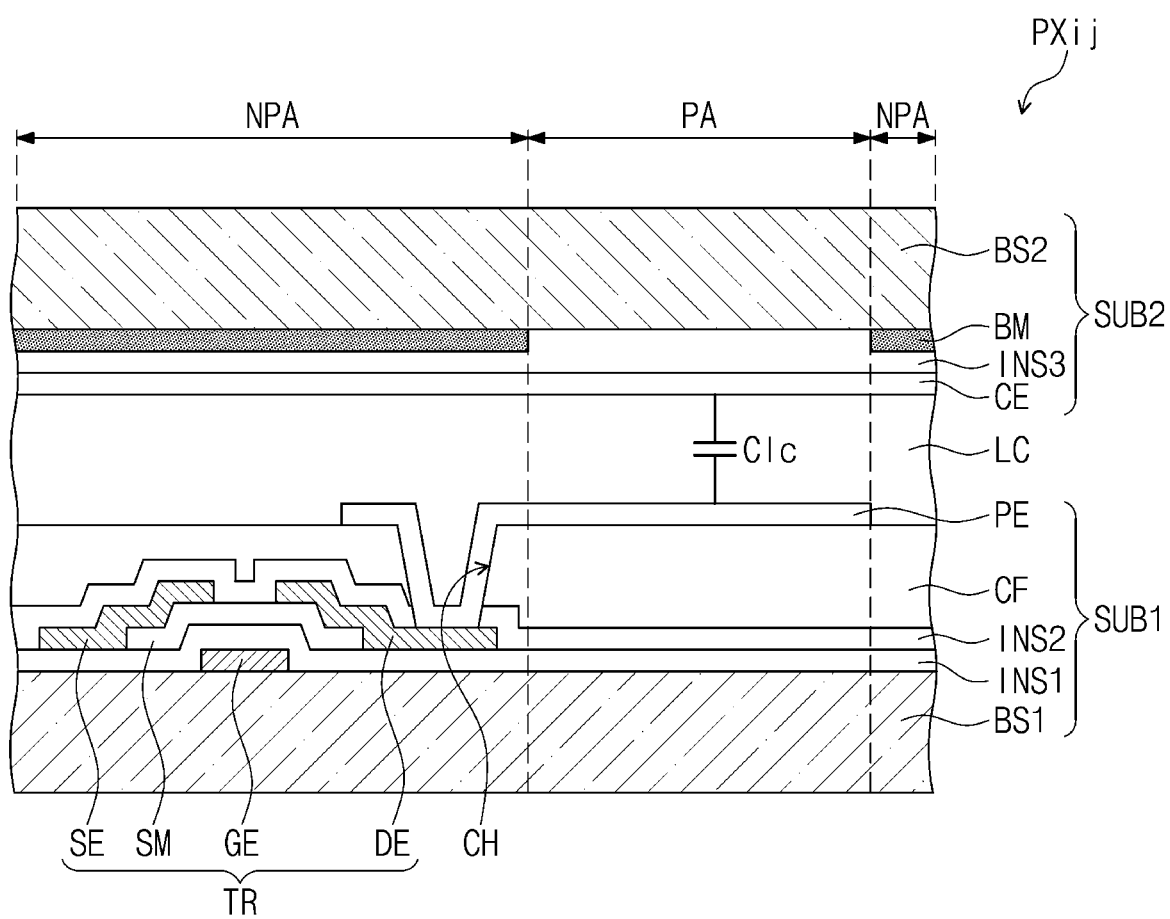
FIG. 4 is a cross-sectional view illustrating an embodiment of the pixel in FIG. 3.

FIG. 4 is a schematic cross-sectional view illustrating an embodiment of the pixel PXij in FIG. 3. In a plane defined by the first direction DR1 and the second direction DR2 which cross each other, the horizontal direction in FIG. 4 may represent the first direction DR1 and/or the second direction DR2.

The storage capacitor Cst is omitted in FIG. 4 for convenience of description.

Referring to FIG. 4, the first substrate SUB1 may include a first base substrate BS1, the transistor TR, the color filter CF (e.g., color filter layer), and the pixel electrode PE. A planar area of the pixel PXij may be defined along the plane defined by the first direction DR1 and the second direction DR2 which cross each other. The planar area of the pixel PXij may include a pixel area PA and a non-pixel area NPA which is adjacent to the pixel area PA. In a plan view, the non-pixel area NPA may surround the pixel area PA, but is not limited thereto. The transistor TR may be disposed in the non-pixel area NPA, and the pixel electrode PE may be disposed in the pixel area PA.

The first base substrate BS1 may be a transparent or opaque insulation substrate. In an embodiment, for example, the first base substrate BS1 may include a silicon substrate, a glass substrate or a plastic substrate.

A gate electrode GE of the transistor TR may be disposed on the first base substrate BS1. The gate electrode GE may be substantially branched from the gate line GLi. A first insulation layer INS' may be disposed on the first base substrate BS1 to cover the gate electrode GE. The first insulation layer INS' may be defined as a gate insulation layer. The first insulation layer INS1 may be an inorganic insulation layer including an inorganic material.

A semiconductor layer SM of the transistor TR may be disposed on the first insulation layer INS1 covering the gate electrode GE. Although not shown, the semiconductor layer SM may include an active layer and an ohmic contact layer.

A source electrode SE and a drain electrode DE of the transistor TR may be spaced apart from each other along the semiconductor layer SM and along the first insulation layer INS1. The semiconductor layer SM may provide a conductive channel of the transistor TR between the source electrode SE and the drain electrode DE.

A second insulation layer 11\152 may be disposed on the first insulation layer INS1 to cover the source electrode SE and the drain electrode DE. The source electrode SE may be substantially branched from the data line DLj. The second insulation layer INΩ may be defined as a passivation layer and may be an inorganic insulation layer including an inorganic material.

The color filter CF may be disposed on the second insulation layer INΩ. A contact hole CH exposing the drain electrode DE may be defined extended through a thickness of the color filter CF and a thickness of the second insulation layer INΩ.

A portion of the pixel electrode PE which is in the pixel area PA may be disposed on the color filter CF. The pixel electrode PE may extend from the pixel area PA, to dispose a portion of the pixel electrode PE in the non-pixel area NPA. The pixel electrode PE is electrically connected to the drain electrode DE at the contact hole CH, at the portion of the pixel electrode PE in the non-pixel area NPA.

The first substrate SUB1 is disposed facing the second substrate SUB2 with the liquid crystal layer LC therebetween. The second substrate SUB2 may include a second base substrate BS2, a black matrix BM (e.g., light blocking layer), a third insulation layer 11\153, and the common electrode CE. The second base substrate BS2 may include a same material as the first base substrate BS1.

The black matrix BM corresponding to the non-pixel area NPA may be disposed below the second base substrate BS2. The third insulation layer INS3 may be disposed below the second base substrate BS2 to cover the black matrix BM. The common electrode CE may be disposed below the third insulation layer INS3.

The liquid crystal capacitor Clc may include the pixel electrode PE, the common electrode CE facing the pixel electrode PE, and the liquid crystal layer LC disposed between the pixel electrode PE and the common electrode CE.

Figure 5:
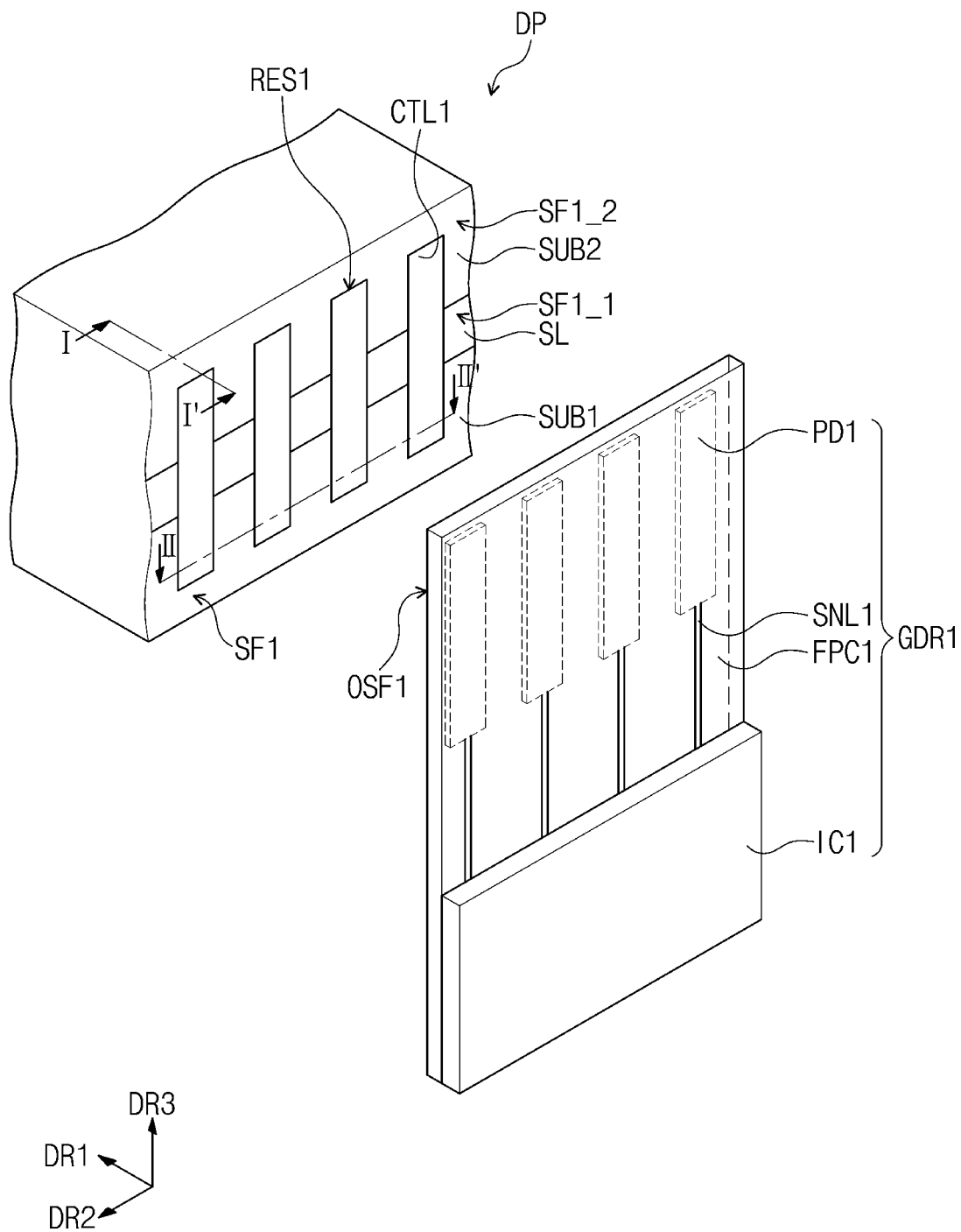
FIG. 5 is a perspective view illustrating an embodiment of a side surface of a display panel relative to a gate driver in FIG. 2.

FIG. 5 is a view illustrating a perspective view of an embodiment of an outer side surface of the display panel DP relative to the first gate driver GDR1 in FIG. 2.

Referring to FIG. 5, a first recessed portion RES1 (e.g., first recess) provided in plural (e.g., a plurality of first recessed portions RES1) may be defined in one outer side surface of the display panel DP. The first recessed portions RES1 may be arranged adjacent to each other along the second direction DR2 and may each extend along the third direction DR3. A length of the first recessed portion RES1 may be defined along the third direction DR3 while a width may be defined along the second direction DR2. The first recessed portions RES1 may be defined at a first side surface SF1 of the first substrate SUB1 and each extend from the first side surface SF1 to each of the corresponding side surface of the encapsulation layer SL and the corresponding side surface of the second substrate SUB2.

A same one of the first recessed portions RES1 may be defined recessed from the first side surface SF1 (e.g., first outer side surface), a third side surface SF1_1 (e.g., third outer side surface) of the encapsulation layer SL which is in a same plane as the first side surface SF1, and a fourth side surface SF1_2 (e.g., fourth outer side surface) of the second substrate SUB2 which is in the same plane as the first side surface SF1. The first recessed portions RES1 may be continuously defined along the third direction DR3 and corresponding to each of the first side surface SF1, the third side surface SF1_1 defined by the encapsulation layer SL, and the fourth side surface SF1_2 defined by the second substrate SUB2.

The display panel DP may include a first conductive layer CTL1 (e.g., first conductive pattern) provided in plural (e.g., a plurality of first conductive layers CTL1) respectively disposed in the first recessed portions RES1. The first conductive layers CTL1 may be arranged adjacent to each other along the second direction DR2 and may each extend along the third direction DR3. The first conductive layers CTL1 each may have a rectangular shape in a view along the first direction DR1, extending further along the third direction DR3 than along the second direction DR2. The first conductive layers CTL1 of the display panel DP may be exposed to outside the display panel DP at ends thereof. An outer surface of the first conductive layer CTL1 which is exposed to outside the display panel DP may be coplanar with each of the first side surface SF1, the third side surface SF1_1 and the fourth side surface SF1_2.

The first flexible circuit board FPC1 of the first gate driver GDR1 may be disposed to commonly face the first side surface SF1, the third side surface SF1_1 defined by the encapsulation layer SL, and the fourth side surface SF1_2 defined by the second substrate SUB2. The first gate driver GDR1 may include a first pad PD1 provided in plural (e.g., a plurality of first pads PD1) disposed on or protruded from a first surface OSF1 (e.g., an inner surface) of the first flexible circuit board FPC1 which faces the display panel DP. Each of the first pads PD1 may include a conductive material.

The first pads PD1 may be arranged adjacent to each other along the second direction DR2 and may each extend along the third direction DR3. Each of the first pads PD1 may have a rectangular shape in a plan view along the first direction DR1, extending further along the third direction DR3 than along the second direction DR2.

When viewed along the first direction DR1, the first pads PD1 may correspond to the first conductive layers CTL1. The first gate driver GDR1 may include a first driving chip IC1 and a first line SNL1 provided in plural (e.g., a plurality of first lines SNL1 or first conductive lines) respectively electrically connected to the first pads PD1. The first driving chip IC1 and the first lines SNL1 may be disposed on or protruded from a surface opposite to the first surface OSF1 (e.g., outer surface) of the first flexible circuit board FPC1. A single one of the first driving chip IC1 may correspond to each of the first lines SNL1, without being limited thereto.

Although not shown, the first lines SNL1 at the outer surface of the first flexible circuit board FPC1 may be electrically connected to the first pads PD1 at the first surface OSF1 through via-holes defined in or extended through a thickness of the first flexible circuit board FPC1. A thickness of the first flexible circuit board FPC1 is defined along the first direction DR1, as illustrated in FIGS. 5 and 6.

Figure 6:
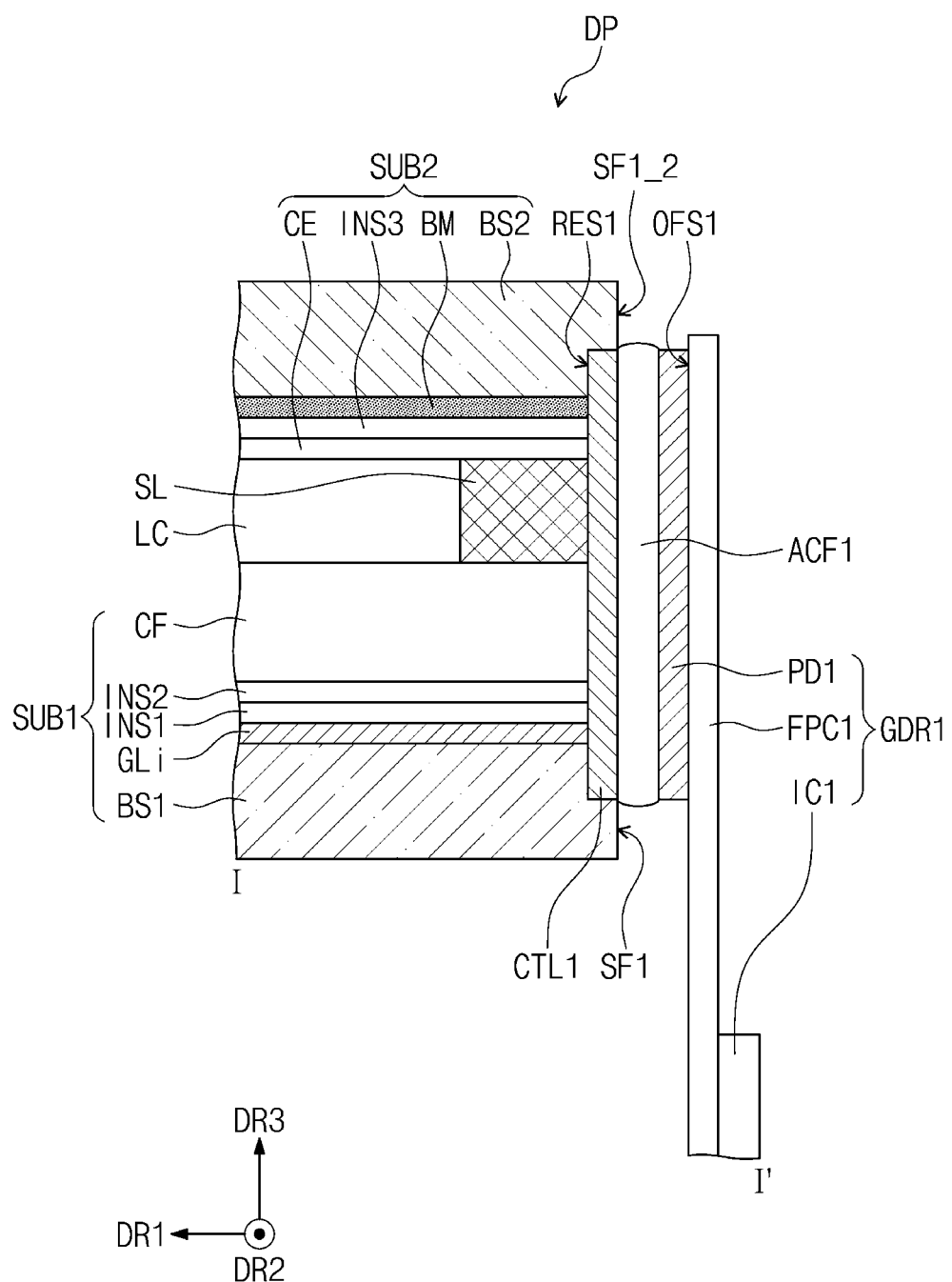
FIG. 6 is a cross-sectional view taken along line I-I' of FIG. 5.
Figure 7:
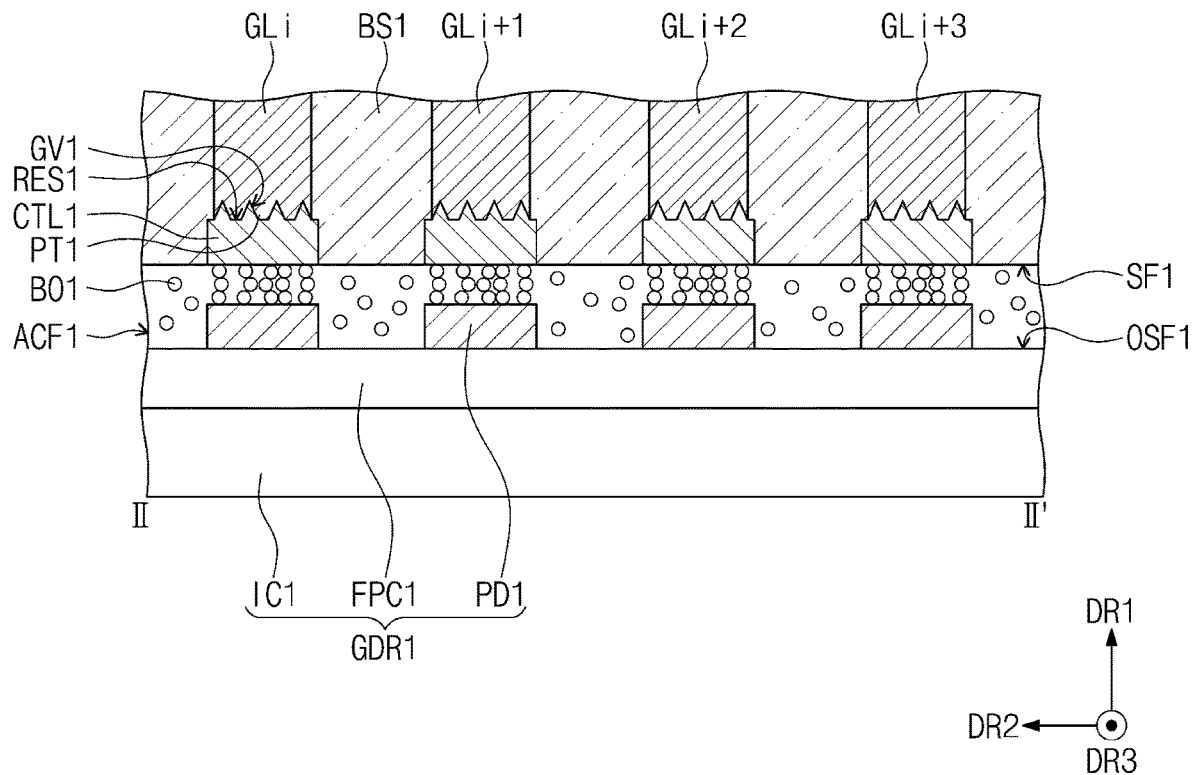
FIG. 7 is a cross-sectional view taken along line II-IF of FIG. 5.
Figure 8:
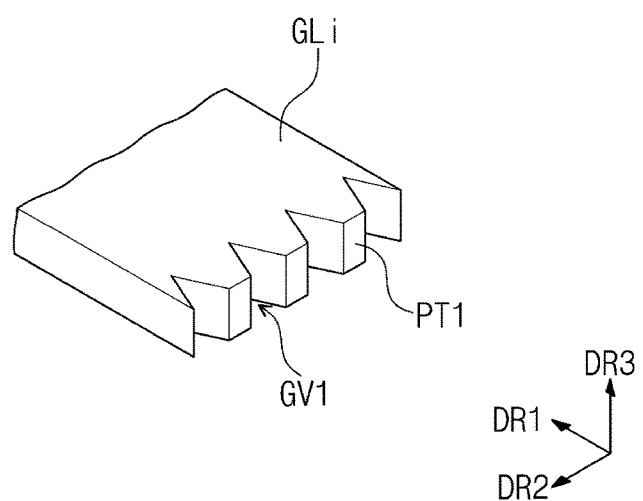
FIG. 8 is a perspective view illustrating an embodiment of an end of a gate line in FIG. 7.

FIG. 6 is a cross-sectional view taken along line I-I' of FIG. 5. FIG. 7 is a cross-sectional view taken along line II-IF of FIG. 5. FIG. 8 is a perspective view illustrating an embodiment of an end of the gate line GLi in FIG. 7.

In FIG. 7, gate lines GLi to GLi+3 and first conductive layers CTL1 disposed on the first base substrate BS1 are exemplarily illustrated.

Referring to FIG. 6, the encapsulation layer SL may be disposed at an edge (e.g., outer edge) of the first substrate SUB1 and an edge (e.g., outer edge) of the second substrate SUB2, to attach the first substrate SUB1 and the second substrate SUB2 to each other. The liquid crystal layer LC may be accommodated between the first and second substrates SUB1 and SUB2 by the encapsulation layer SL at outer edges of the display panel DP.

A bottom of the first recessed portion RES1 may be defined by end side surfaces of each the first base substrate BS1, the gate line GLi, the first and second insulation layers INS1 and INS2, the color filter CF, the encapsulation layer SL, the common electrode CE, the third insulation layer INS3, the black matrix BM, and the second base substrate BS2. The end side surfaces may be recessed from each of the first side surface SF1, the third side surface SF1_1 and the fourth side surface SF1_2 in FIG. 5 which are at a same side of the display panel DP. The end side surfaces may be coplanar with each other to together define the bottom of the first recessed portion RES1. The bottom of the first recessed portion RES1 may be furthest from each of the first side surface SF1, the third side surface SF1_1 and the fourth side surface SF1_2, so as to be spaced apart from an outer surface of the display panel DP.

The end side surface of the gate line GLi may be defined at an end (e.g., distal end) of the gate line GLi and may contact the first conductive layer CTL1 at the first recessed portion RES1. Thus, the gate line GLi may be electrically connected to the first conductive layer CTL1 at the first recessed portion RES1. In detail, the gate line GLi may be electrically connected to the first conductive layer CTL1 at the bottom of the first recessed portion RES1.

The first pad PD1 may be electrically connected to the first conductive layer CTL1 and the gate line GLi. A first anisotropic conductive film ACF1 may be disposed between the first pad PD1 and the first conductive layer CTL1 to electrically connect the first conductive layer CTL1 and the gate line GLi to each other.

The first anisotropic conductive film ACF1 may bury the first conductive layer CTL1 within the first recessed portion RES1. The first anisotropic conductive film ACF1 may extend further than the first conductive layer CTL1, such as along the second direction DR2 (FIG. 7) and/or along the third direction DR3 (FIG. 6), to bury the first conductive layer CTL1 within the first recessed portion RES1. As the first conductive layer CTL1 is buried by the first anisotropic conductive film ACF1, the first conductive layer CTL1 may be minimally exposed to outside the display panel DP. Thus, since external moisture is blocked from the first conductive layer CTL1 by the first anisotropic conductive film ACF1, the first conductive layer CTL1 may not be damaged by the external moisture.

The first pad PD1 and the first conductive layer CTL1 may be electrically connected to each other by the first anisotropic conductive film ACF1. The first pad PD1 may be electrically connected to the gate line GLi through the first conductive layer CTL1.

Referring to FIG. 7, the first anisotropic conductive film ACF1 may be disposed between the first pads PD1 and the first conductive layers CTL1. The first anisotropic conductive film ACF1 may define a conductive layer which is commonly disposed corresponding to each of the first pads PD1 and the first conductive layers CTL1, and areas therebetween along the second direction DR2. In an embodiment, the first flexible circuit board FPC1 of FIGS. 6 and 7 may have been pressed along the first direction DR1 and toward the first side surface SF1, the third side surface SF1_1 and the fourth side surface SF1_2 in FIG. 5.

In an embodiment of a pressing operation within a method of providing a display device DD, a first conductive ball BO1 provided in plural (e.g., first conductive balls BO1) of the first anisotropic conductive film ACF1 disposed between corresponding ones among the first pads PD1 and the first conductive layers CTL1, may contact each other to electrically connect the first pads PD1 and the first conductive layers CTL1 to each other. As a result, the first pads PD1 may be electrically connected to the gate lines GLi to GLi+3 among the gate lines GL1 to GLm, through the first conductive layers CTL1.

Along the second direction DR2, each of the first recessed portions RES1 and each of the first conductive layers CTL1 may have a width greater than a width of each of the gate lines GLi to GLi+3.

Referring to FIGS. 6 and 7, the first flexible circuit board FPC1 may be connected to the first conductive layers CTL1 and the gate lines GLi to GLi 3, through the first pads PD1, respectively. Thus, the first gate driver GDR1 may be connected to the display panel DP at a first outer side surface of the display panel DP. Although not shown, the second gate driver GDR2 may be connected to a second outer side surface of the display panel DP in the same manner.

The first flexible circuit board FPC1 may be extended parallel to the third direction DR3. That is, as a same one of the first gate driver GDR1 is connected to the display panel DP at each of the first side surface SF1, the third side surface SF1_1 and the fourth side surface SF1_2, the first flexible circuit board FPC1 may extend along the third direction DR3 which crosses a plane of the first substrate SUB1 (e.g., plane defined by the first direction DR1 and the second direction DR2). The first flexible circuit board FPC1 may be disposed a plane defined by the second direction DR2 and the third direction DR3 which cross each other.

In a conventional display device where the first flexible circuit board FPC1 is disposed parallel to the plane of the first substrate SUB1 and connected to a top surface of the first substrate SUB1 which extends from an outer side surface of the first substrate SUB1, a planar area (e.g., bezel area) along the plane of the first substrate SUB1 in which the first and second gate drivers GDR1 and GDR2 are disposed may increase. However, in one or more embodiment of the invention, since the first and second gate drivers GDR1 and GDR2 are connected to the display panel DP at outer side surfaces opposite to each other along the first direction DR1, respectively, the planar area (e.g., bezel area) along the plane of the first substrate SUB1 in which the first and second gate drivers GDR1 and GDR2 are disposed may be minimized.

Referring to FIGS. 7 and 8, an end of each of the gate lines GLi to GLi+3 may include a first protruding portion PT1 provided in plural (e.g., a plurality of first protruding portions PT1) and first groove GV1 provided in plural (e.g., a plurality of first grooves GV1), alternating with each other. The first protruding portions PT1 may define an end side surface extending along the third direction DR3. The first protruding portions PT1 may be spaced apart from each other along the second direction DR2. That is, end side surfaces within a same one of the gate lines GLi to GLi+3 may be arranged along the second direction DR2. The first grooves GV1 may be defined between first protruding portions PT1 which are sequential along the second direction DR2. In a view along the third direction DR3 (e.g., FIG. 7), each of the first protruding portions PT1 may have a planar shape of a trapezoid, and each of the first grooves GV1 may have a "V"-shape. That is, respective ends of the gate lines GLi to GLi+3 define a plurality of first protruding portions PT1 protruded along the first direction DR1 and arranged along the second direction DR2.

As the end of each of the gate lines GLi to GLi+3 includes the first protruding portions PT1, a surface area at the end of each of the gate lines GLi to GLi+3 may increase, since a plurality of end side surfaces are defined for each one among the gate lines GLi to GLi+3. Thus, a planar area at which ends of the gate lines GLi to GLi+3 contact the first conductive layers CTL1, may increase. A contact area may be defined by planar areas of end surfaces along a plane defined by the second direction DR2 and the third direction DR3, and planar areas of surfaces inclined from the end surfaces. Since the contact area increases, an electrical connection performance between respective ones of the first conductive layers CTL1 and the gate lines GLi to GLi+3 may improve.

Figure 9:
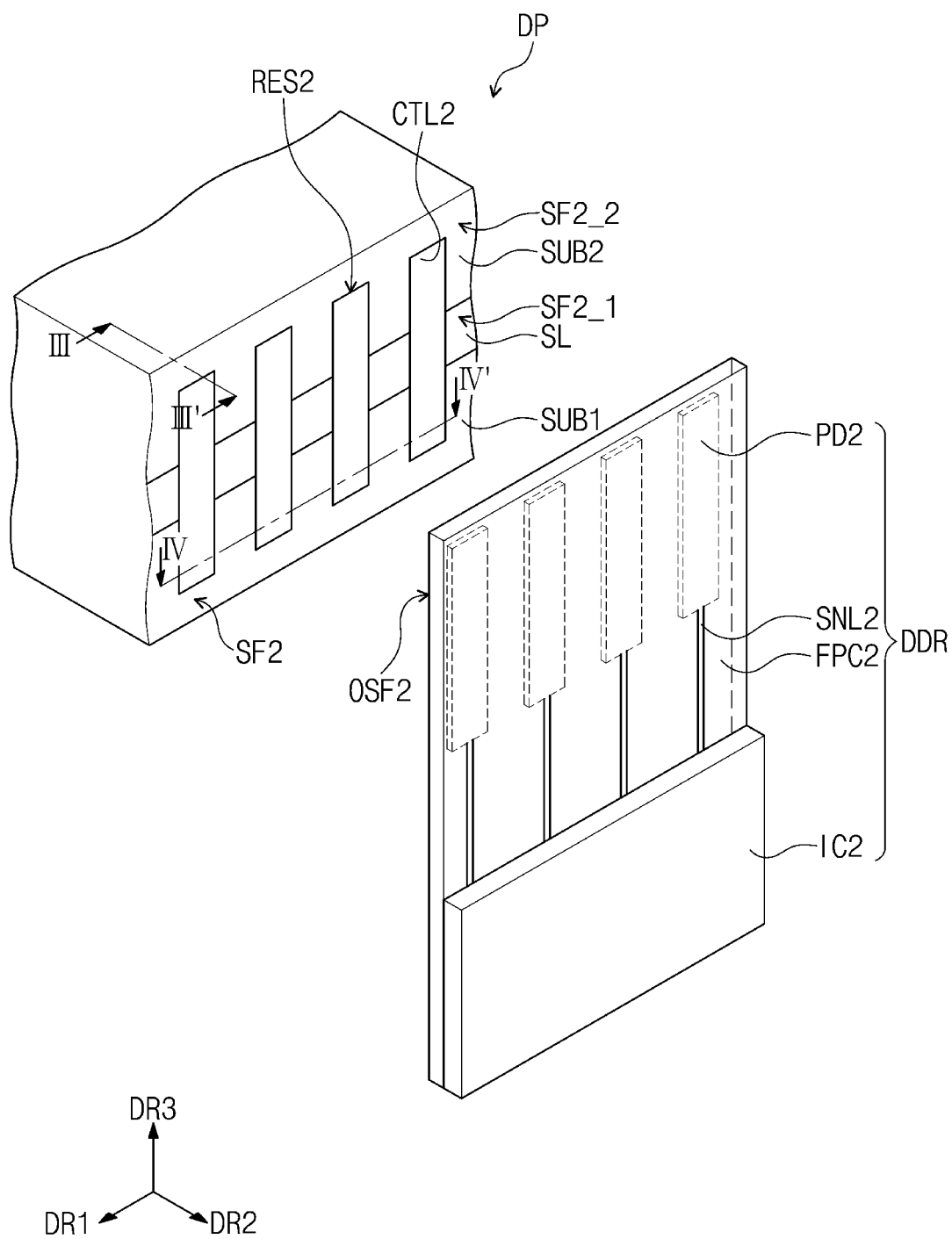
FIG. 9 is a view illustrating an embodiment of a side surface of the display panel relative to a data driver in FIG. 2.

FIG. 9 is a view illustrating a perspective view of an embodiment of an outer side surface of the display panel DP relative to the data driver DDR in FIG. 2.

Referring to FIG. 9, a second recessed portion RES2 (e.g., second recess) provided in plural (e.g., a plurality of second recessed portions RES2) may be defined in an outer side surface of the display panel DP. The second recessed portions RES2 may be arranged adjacent to each other along the first direction DR1 and may each extend along the third direction DR3. The second recessed portions RES2 may be defined at the second side surface SF2 of the first substrate SUB1 and each extend from the second side surface SF2 to each of the corresponding side surface of the encapsulation layer SL and the corresponding side surface of the second substrate SUB2.

A same one of the second recessed portions RES2 may be defined recessed from the second side surface SF2, a fifth side surface SF2_1 (e.g., fifth outer side surface) defined by the encapsulation layer SL which is disposed in a same plane as the second side surface SF2, and a sixth side surface SF2_2 (e.g., sixth outer side surface) defined by the second substrate SUB2 which is disposed in the same plane as the second side surface SF2. The second recessed portions RES2 may be continuously defined along the third direction DR3 and corresponding to each of the second side surface SF2, the fifth side surface SF2_1 defined by the encapsulation layer SL, and the sixth side surface SF2_2 defined by the second substrate SUB2.

The display panel DP may include a second conductive layer CTL2 (e.g., second conductive pattern) provided in plural (e.g., a plurality of second conductive layers CTL2) respectively disposed in the second recessed portions RES2. The second conductive layers CTL2 may be arranged adjacent to each other along the first direction DR1 and each extend in the third direction DR3. The second conductive layers CTL2 each may have a rectangular shape in a view along the second direction DR2, extending further along the third direction DR3 than along the first direction DR1. The second conductive layers CTL2 of the display panel DP may be exposed to outside the display panel DP at ends thereof. An outer surface of the second conductive layer CTL2 which is exposed to outside the display panel DP may be coplanar with each of the second side surface SF2, the fifth side surface SF2_1 and the sixth side surface SF2_2.

A second flexible circuit board FPC2 of the data driver DDR may be disposed to commonly face the second side surface SF2, the fifth side surface SF2_1 defined by the encapsulation layer, and the sixth side surface SF2_2 defined by the second substrate SUB2. The data driver DDR may include a second pad PD2 provided in plural (e.g., a plurality of second pads PD2) disposed on or protruded from a first surface OSF2 (e.g., inner surface) of the second flexible circuit board FPC2 which faces the display panel DP. Each of the second pads PD2 may include a conductive material.

The second pads PD1 may be arranged adjacent to each other along the first direction DR1 and may each extend along the third direction DR3. The second pads PD2 each may have a rectangular shape in a plan view along the second direction DR2, extending further along the third direction DR3 than along the first direction DR1.

When viewed along the second direction DR2, the second pads PD2 may correspond to the second conductive layers CTL2. The data driver DDR may include a second driving chip IC2 and a second line SNL2 provided in plural (e.g., a plurality of second lines SNL2 of second conductive lines) respectively electrically connected to the second pads PD2. The second driving chip IC2 and the second lines SNL2 may be disposed on or protruded from a surface opposite to the first surface OSF2 (e.g., outer surface) of the second flexible circuit board FPC2. A single one of the second driving chip IC2 may correspond to each of the second lines SNL2, without being limited thereto.

Although not shown, the second lines SNL2 at the outer surface of the second flexible circuit board FPC2 may be electrically connected to the second pads PD2 at the first surface OSF2 through via-holes defined in or extended through a thickness of the second flexible circuit board FPC2. A thickness of the second flexible circuit board FPC2 is defined along the second direction DR2, as illustrated in FIGS. 9 and 10.

Figure 10:
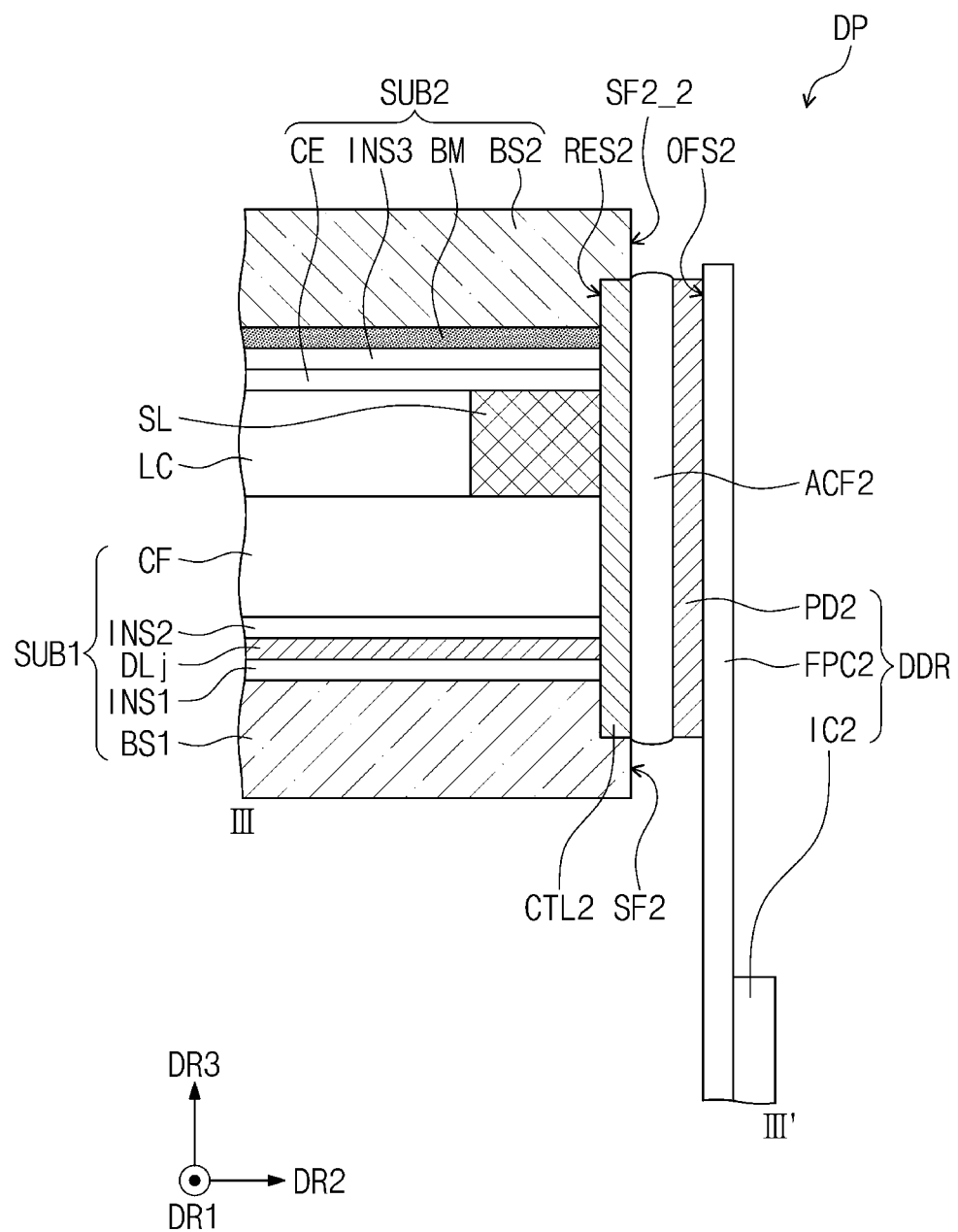
FIG. 10 is a cross-sectional view taken along a line of FIG. 9.
Figure 11:
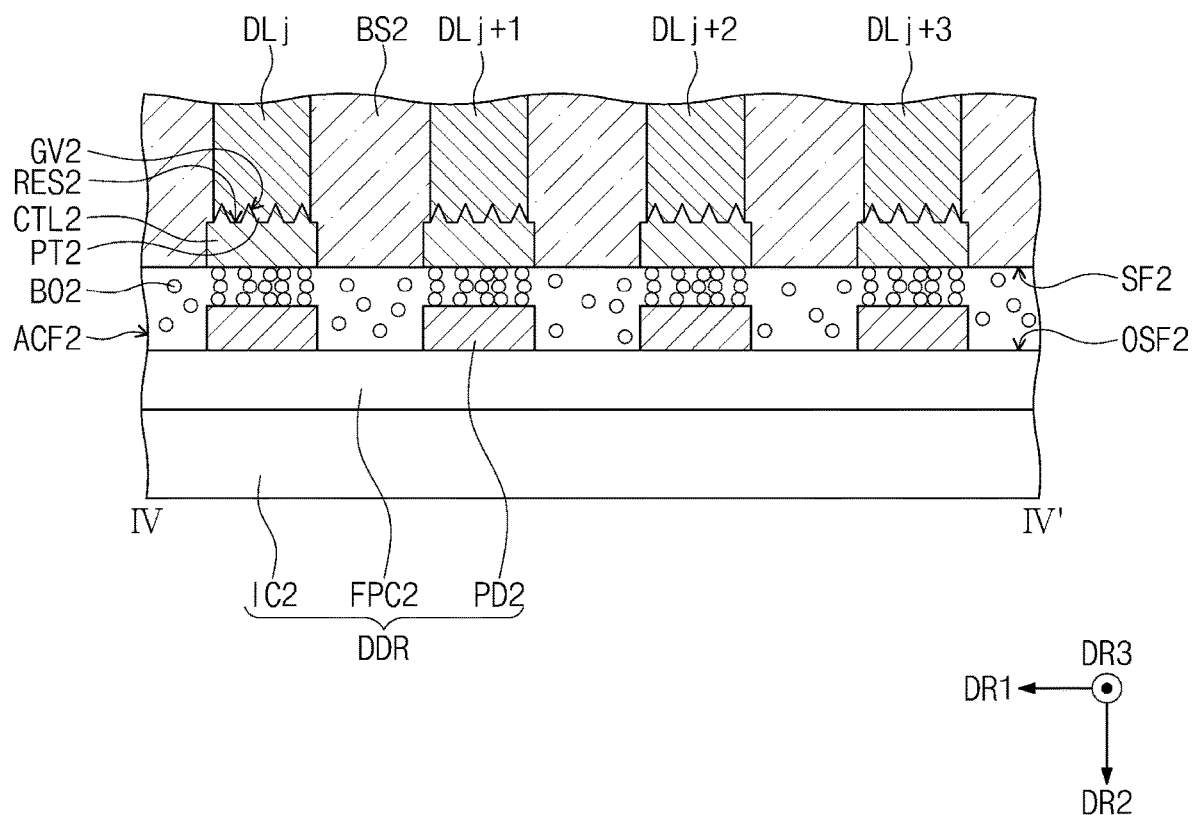
FIG. 11 is a cross-sectional view taken along line IV-IV' of FIG. 9.
Figure 12:
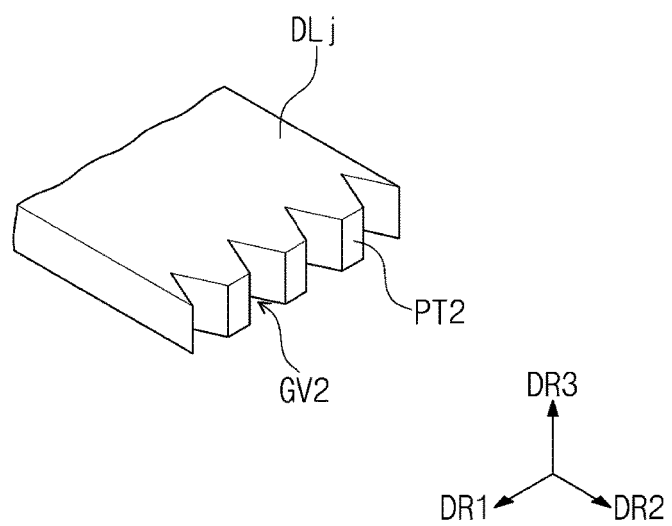
FIG. 12 is a perspective view illustrating an embodiment of an end of a data line in FIG. 11.

FIG. 10 is a cross-sectional view taken along line of FIG. 9. FIG. 11 is a cross-sectional view taken along line IV-IV' of FIG. 9. FIG. 12 is a perspective view illustrating an embodiment of an end of the data line DLj in FIG. 10.

In FIG. 11, data lines DLj to DLj+3 and second conductive layers CTL2 disposed on the first base substrate BS1 are exemplarily illustrated.

Referring to FIG. 10, a bottom of the second recessed portion RES2 may be defined by end side surfaces of each of the first base substrate BS1, the data line DLj, the first and second insulation layers INS1 and INK, the color filter CF, the encapsulation layer SL, the common electrode CE, the third insulation layer INS3, the black matrix BM, and the second base substrate BS2. The end side surfaces may each be recessed from the second side surface SF2, the fifth side surface SF2_1 and the sixth side surface SF2_2 in FIG. 9 which are at a same side of the display panel DP. The end side surfaces may be coplanar with each other to together define the bottom of the second recessed portion RES2. The bottom of the second recessed portion RES2 may be furthest from each of the second side surface SF2, the fifth side surface SF2_1 and the sixth side surface SF2_2, so as to be spaced apart from an outer surface of the display panel DP.

The end side surface of the data line DLj may be defined at an end of the data line DLj and may contact the second conductive layer CTL2 at the second recessed portion RES2. Thus, the data line DLj may be electrically connected to the second conductive layer CTL2 at the second recessed portion RES2. In detail, the data line DLi may be electrically connected to the second conductive layer CTL2 at the bottom of the second recessed portion RES2.

The second pad PD2 may be electrically connected to the second conductive layer CTL2 and the data line DLj. A second anisotropic conductive film ACF2 may be disposed between the second pad PD2 and the second conductive layer CTL2 to electrically connect the second conductive layer CTL2 and the data line DLi to each other.

The second anisotropic conductive film ACF2 may bury the second conductive layer CTL2 in the second recessed portion RES2. The second anisotropic conductive film ACF2 may extend further than the second conductive layer CTL2, such as along the first direction DR1 (FIG. 11) and/or along the third direction DR3 (FIG. 10), to bury the second conductive layer CTL2 within the second recessed portion RES2. Thus, as the second conductive layer CTL2 is minimally exposed to outside the display panel DP by the second anisotropic conductive film ACF2, external moisture is blocked from the second conductive layer CTL2, and the second conductive layer CTL2 may not be damaged by the external moisture.

The second pad PD2 and the second conductive layer CTL2 may be electrically connected to each other by the second anisotropic conductive film ACF2. The second pad PD2 may be electrically connected to the data line DLj through the second conductive layer CTL2.

Referring to FIG. 11, the second anisotropic conductive film ACF2 may be disposed between the second pads PD2 and the second conductive layers CTL2. The second anisotropic conductive film ACF2 may define a conductive layer which is commonly disposed corresponding to each of the second pads PD2 and the second conductive layers CTL2, and areas therebetween along the first direction DR1. In an embodiment, the second flexible circuit board FPC2 of FIGS. 10 and 11 may have been pressed toward the second side surface SF2, the fifth side surface SF2_1 and the sixth side surface SF2_2 in FIG. 9.

In an embodiment of a pressing operation within a method of providing a display device DD, a second conductive ball B02 provided in plural (e.g., second conductive balls B02) of the second anisotropic conductive film ACF2 disposed between corresponding ones among the second pads PD2 and the second conductive layers CTL2, may contact each other to electrically connect the second pads PD2 and the second conductive layers CTL2 to each other. As a result, the second pads PD2 may be electrically connected to the data lines DLj to DLj+3, through the second conductive layers CTL2.

Along the first direction DR1, each of the second recessed portions RES2 and each of the second conductive layers CTL2 may have a width greater than a width of each of the data lines DLj to DLj+3.

Referring to FIGS. 10 and 11, the second flexible circuit board FPC2 may be connected to the second conductive layers CTL2 and the data lines DLj to DLj+3 through the second pads PD2, respectively. Thus, the data driver DDR may be connected to the display panel DP at a second outer side surface of the display panel DP.

As a same one of the data driver DDR is connected to the display panel DP at each of the second side surface SF2, the fifth side surface SF2_1 and the sixth side surface SF2_2, the second flexible circuit board FPC2 may extend along the third direction DR3 which crosses the plane of the first substrate SUB1. Since the data driver DDR is connected to one of second side surfaces of the display panel, which are opposite to each other along the second direction DR2, a planar area in which the data driver DDR is disposed may be minimized even in a plan view (e.g., along the third direction DR3).

Referring to FIGS. 11 and 12, an end of each of the data lines DLj to DLj+3 may include a second protruding portion PT2 provided in plural (e.g., a plurality of second protruding portions PT2) and a second groove GV2 provided in plural (e.g., a plurality of second grooves GV2) alternating with each other. The second protruding portions PT2 may define an end side surface extending along the third direction DR3. The second protruding portions PT2 may be spaced apart from each other along the first direction DR1. That is, end side surfaces within a same one of the data lines DLj to DLj+3 may be arranged along the first direction DR1. The second grooves GV2 may be defined between second protruding portions PT2 which are sequential along the first direction DR1. In a view along the third direction DR3 (e.g., FIG. 11), each of the second protruding portions PT2 may have a planar shape of a trapezoid, and each of the second grooves GV2 may have a "V"-shape. That is, respective ends of the data lines DLj to DLj+3 define a plurality of second protruding portions PT2 protruded along the second direction DR2 and arranged along the first direction DR1.

As the end of each of the data lines DLj to DLj+3 includes the second protruding portions PT2, a surface area at the end of each of the data lines DLj to DLj+3 may increase, since a plurality of end side surfaces are defined for each one among the data lines DLj to DLj+3. Thus, a planar area at which ends of the data lines DLj to DLj+3 contact the second conductive layers CTL2 may increase, and thus an electrical connection performance between the second conductive layers CTL2 and the data lines DLj to DLj+3 may improve.

As a result, one or more embodiment of the display device DD increases the contact area between signal lines of a display panel DP and respective conductive layers of an external member such as a circuit board. Additionally, one or more embodiment of the display device DD minimizes external exposure of the conductive layers of the external member to outside the display panel DP.

Figure 13:
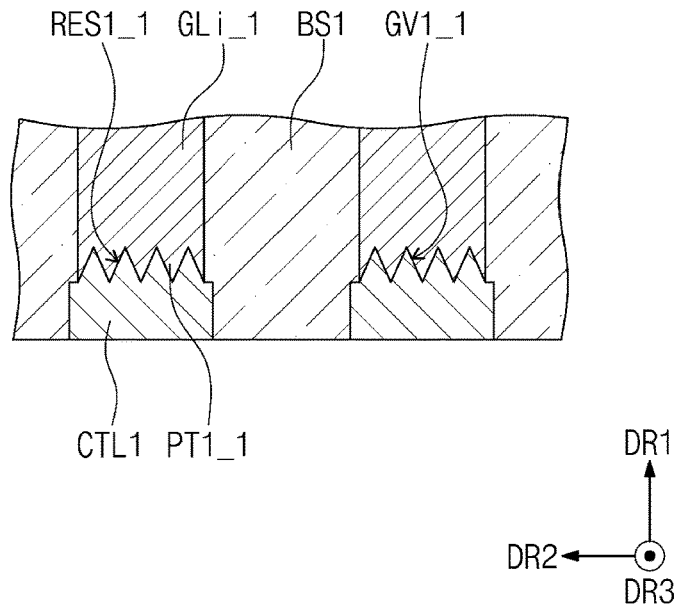
FIGS. 13 and 14 are views respectively illustrating shapes of embodiments of ends of gate lines.
Figure 14:
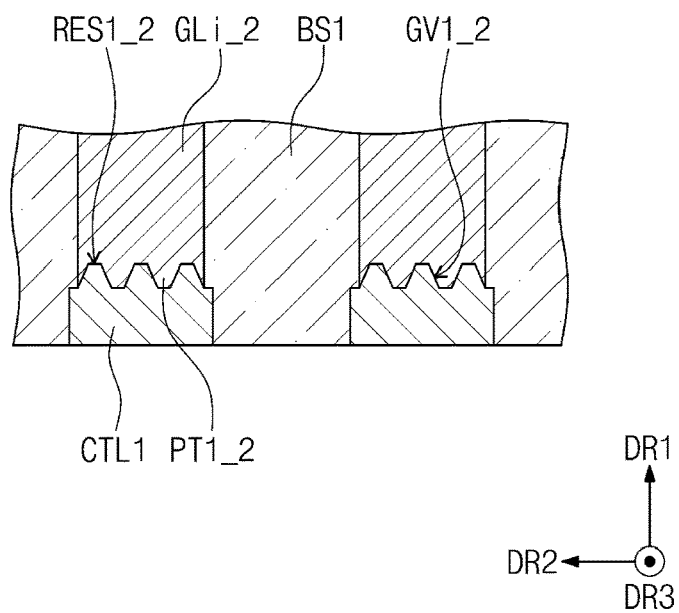

FIGS. 13 and 14 are views respectively illustrating planar shapes of ends of embodiments of gate lines GLi_1 and GLi_2.

Although not shown, a shape of the end of the data line DLj may be changed to a structure similar to that of each of gate lines GLi_1 and GLi_2 in FIGS. 13 and 14.

Referring to FIG. 13, a first conductive layer CTL1 may be disposed in a recessed portion RES1_1 provided in plural. An end of the gate line GLi_1 may include a first protruding portion PT1_1 provided in plural (e.g., a plurality of first protruding portions PT1_1) each extending along the third direction DR3, and arranged along the second direction DR2, and a first groove GV1_1 provided in plural (e.g., a plurality of first grooves GV1_1) which are respectively defined between first protruding portions PT1_1 which are adjacent to each other. In a view along the third direction DR3, each of the first protruding portions PT1_1 may have a triangular shape, and each of the first grooves GV1_1 may have a "V"-shape.

Referring to FIG. 14, a first conductive layer CTL1 may be disposed in a recessed portion RES1_2 provided in plural. An end of the gate line GLi_2 may include a first protruding portion PT1_2 provided in plural (e.g., a plurality of first protruding portions PT1_2) each extending along the third direction DR3, and arranged along the second direction DR2 and a first groove GV1_2 provided in plural (e.g., a plurality of first grooves GV1_2) which are respectively defined between the first protruding portions PT1_2 which are adjacent to each other. In a view along the third direction DR3, each of the first protruding portions PT1_2 may have a trapezoidal shape. In a view along the third direction DR3, each of the first grooves GV1_2 may have a trapezoidal shape.

FIGS. 15 to 22 are views of structures in an embodiment of a method for providing the display device DD.

FIGS. 15 to 22 exemplarily illustrate side surfaces and cross-sections corresponding to those in FIGS. 6 and 7. Also, although a bonding process of the first gate driver GDR1 is exemplarily described in FIGS. 15 to 22, the second gate driver GDR2 and the data driver DDR may be also bonded to the display panel DP in the same manner.

Figure 15:
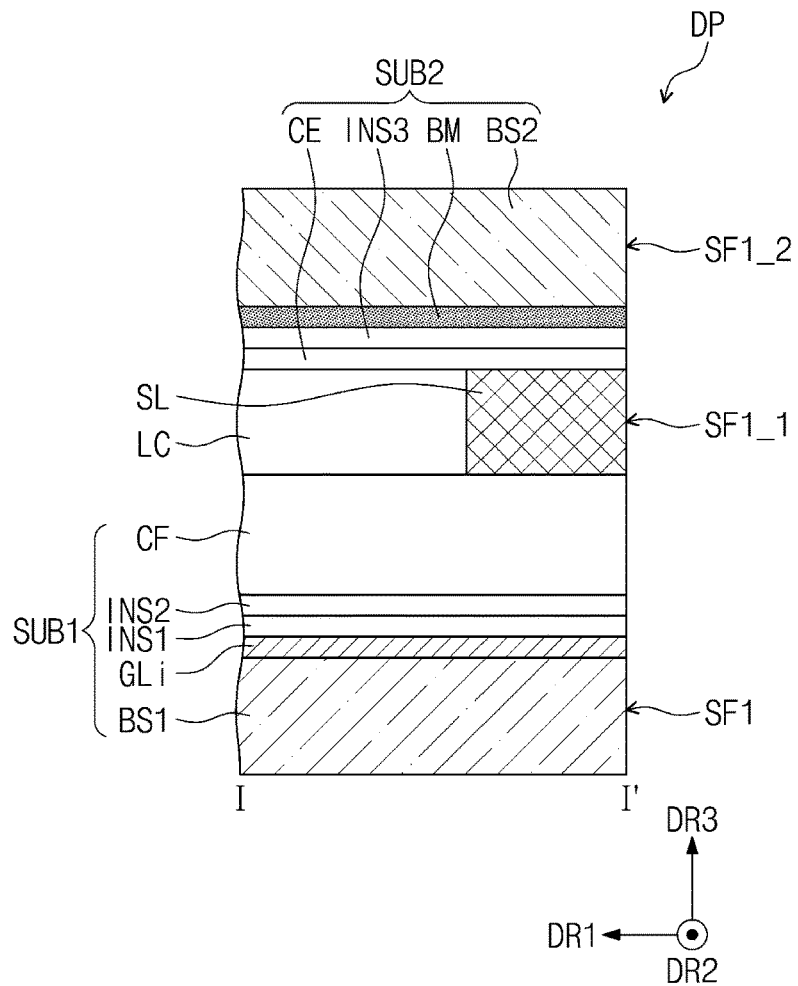
FIGS. 15 to 22 are views of structures in an embodiment of a method for manufacturing the display device.
Figure 16:
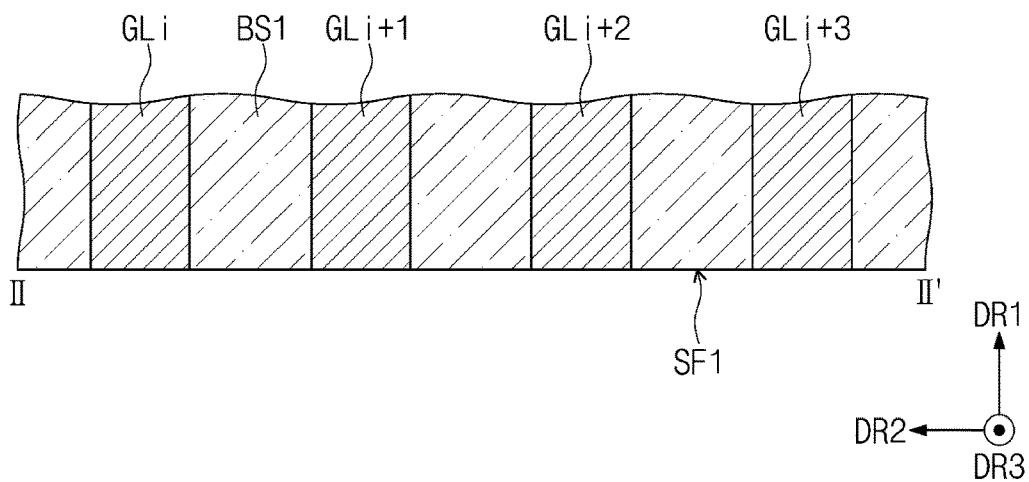

Referring to FIGS. 15 and 16, the display panel DP including the first substrate SUB1 and the second substrate SUB2 which are attached to each other by the encapsulation layer SL, may be provided. Here, the first substrate SUB1 may represent a preliminary form of the first substrate SUB1 in which the first recessed portions RES1 are not yet defined. Outer side surfaces of each of the first side surface SF1, the third side surface SF1_1 and the fourth side surface SF1_2 may be coplanar with each other within a preliminary form of the display panel DP shown in FIG. 15. In detail, end surfaces of gate lines GLi to GLi+3 are coplanar with the first side surface SF1 of the first substrate SUB1.

Figure 17:
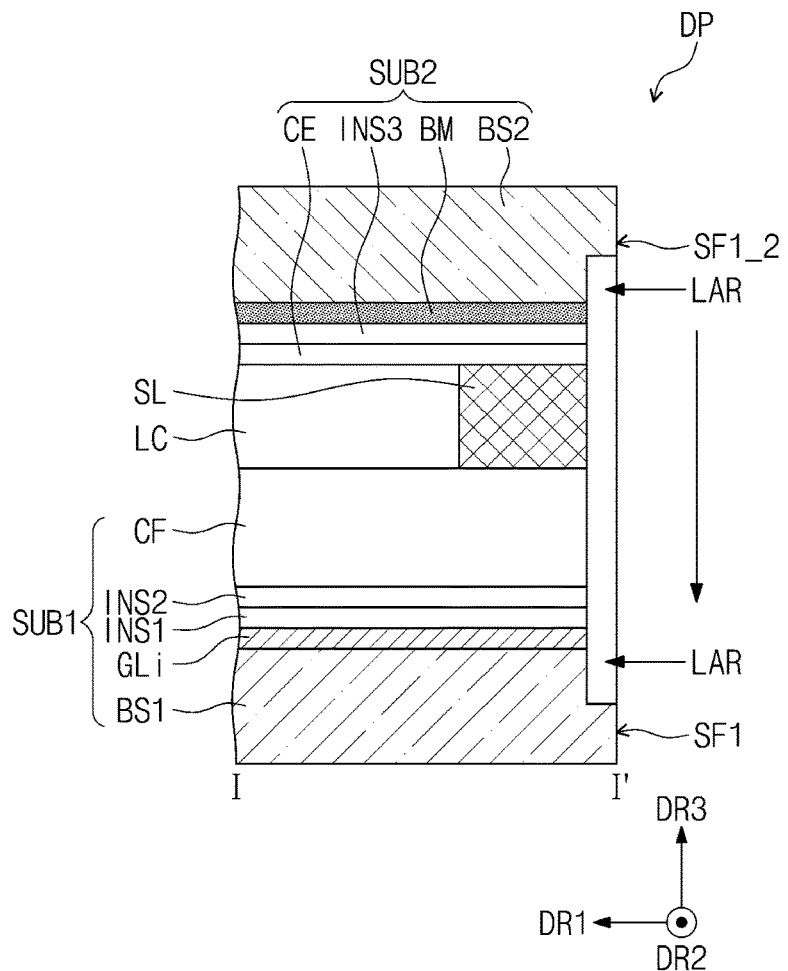
Figure 18:
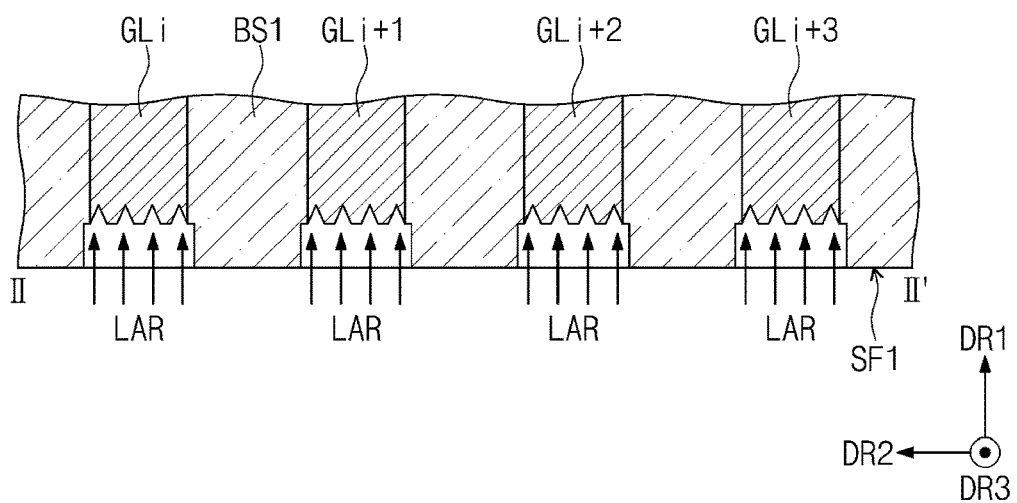

Referring to FIGS. 17 and 18, a laser LAR may be irradiated toward the first side surface SF1, the third side surface SF1_1 and the fourth side surface SF1_2. The first recessed portions RES1 may be provided or formed recessed from each of the first side surface SF1, the third side surface SF1_1 and the fourth side surface SF1_2 by the laser LAR. As the ends of the gate lines GLi to GLi+3 are processed together with other layers within the display panel DP, by the laser LAR, the ends of the gate lines GLi to GLi+3 may include the first protruding portions PT1. The ends of the gate lines GLi to GLi+3 along with other layers within the display panel DP may be exposed to outside the display panel DP, at the first recessed portions RES1.

Figure 19:
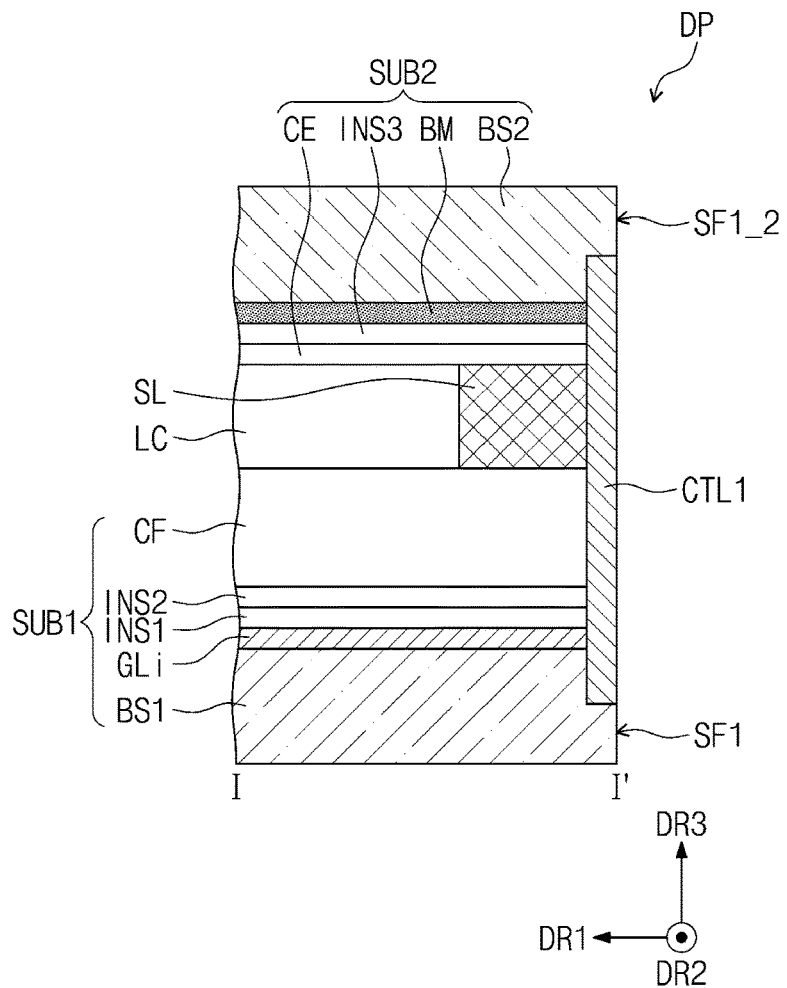
Figure 20:
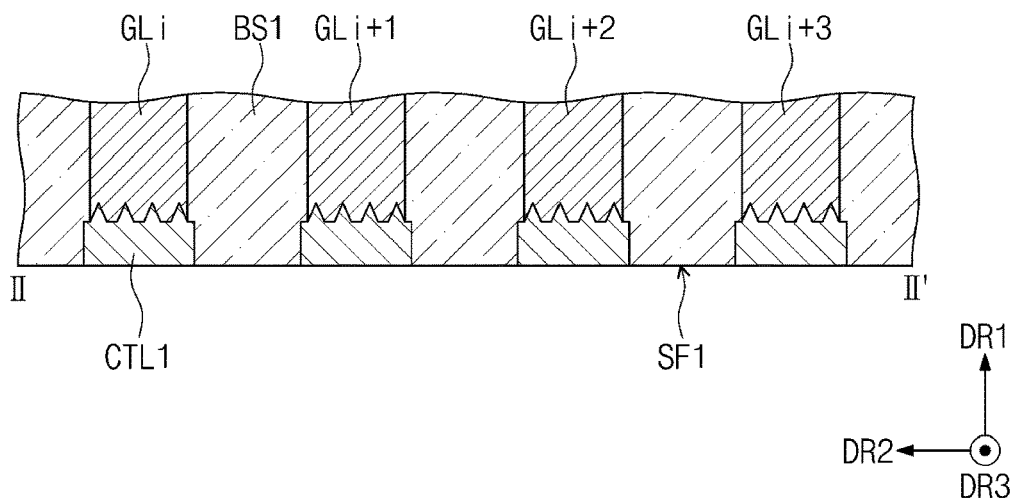

Referring to FIGS. 19 and 20, the first conductive layers CTL1 may be provided in the first recessed portions RES1. In an embodiment, a conductive material such as a conductive paste may be provided to the first recessed portions RES1 in order to form the first conductive layers CTL1 as a plurality of conductive patterns of the display panel DP within the first recessed portions RES1 thereof. The conductive paste may include silver (Ag). An uncured form of the conductive paste may be provided in the first recessed portions RES1 and then cured to thereby form the first conductive layers CTL1 as patterns of a cured conductive material.

The first conductive layers CTL1 may contact exposed ends of the gate lines GLi to GLi+3 at the first recessed portions RES1. In detail, the first conductive layers CTL1 may contact the gate lines GLi to GLi+3 at each of the first protruding portions PT1 and the first grooves GV1 thereof, which are exposed at ends of the gate lines GLi to GLi+3. A shape of the first conductive layers CTL1 may conform to a shape of ends of the gate lines GLi to GLi+3 which is defined by the first protruding portions PT1 together with the first grooves GV1. Thus, the first conductive layers CTL1 may be electrically connected to the gate lines GLi to GLi+3 within the first recessed portions RES1, particularly at a bottom thereof.

Figure 21:
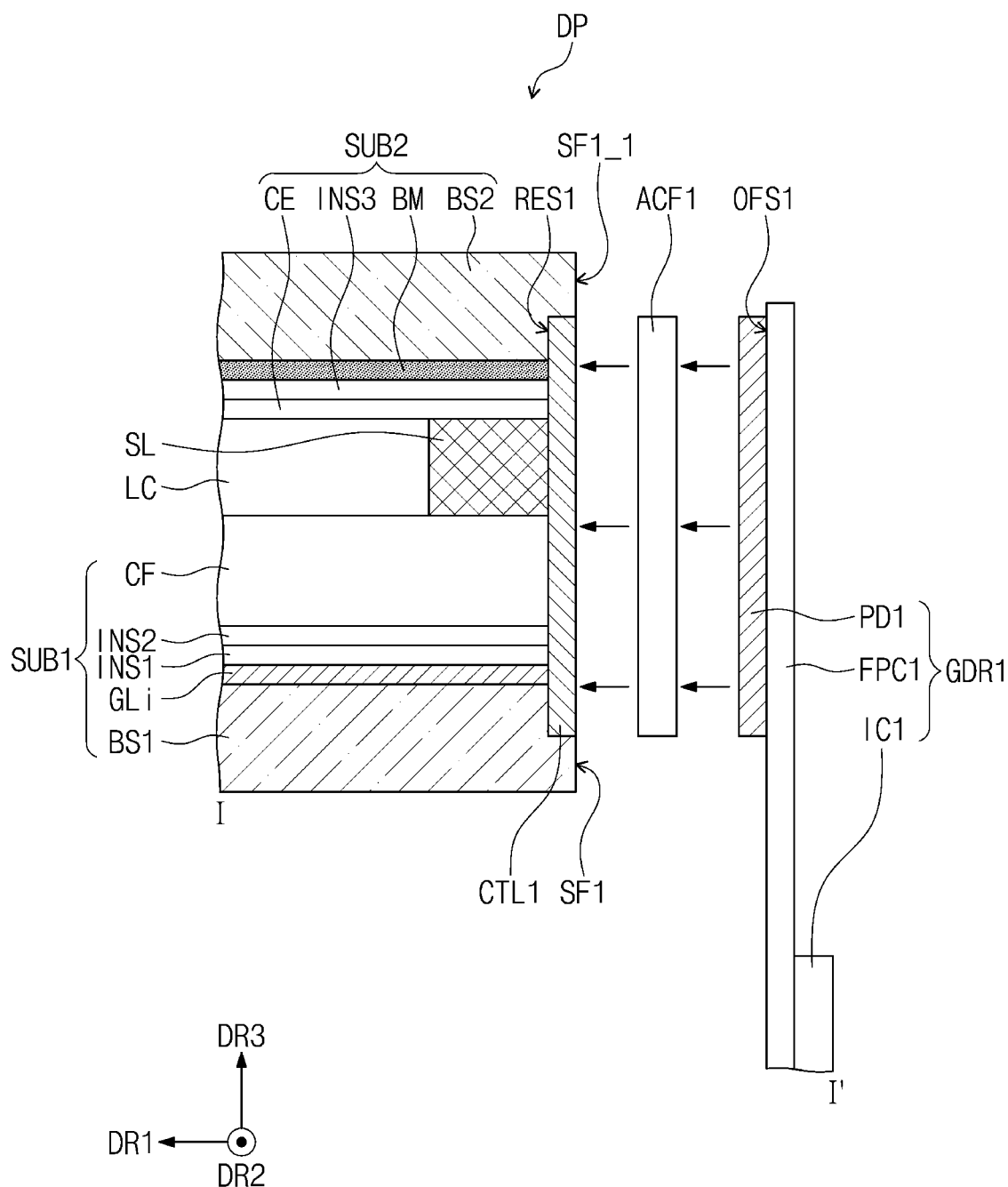
Figure 22:
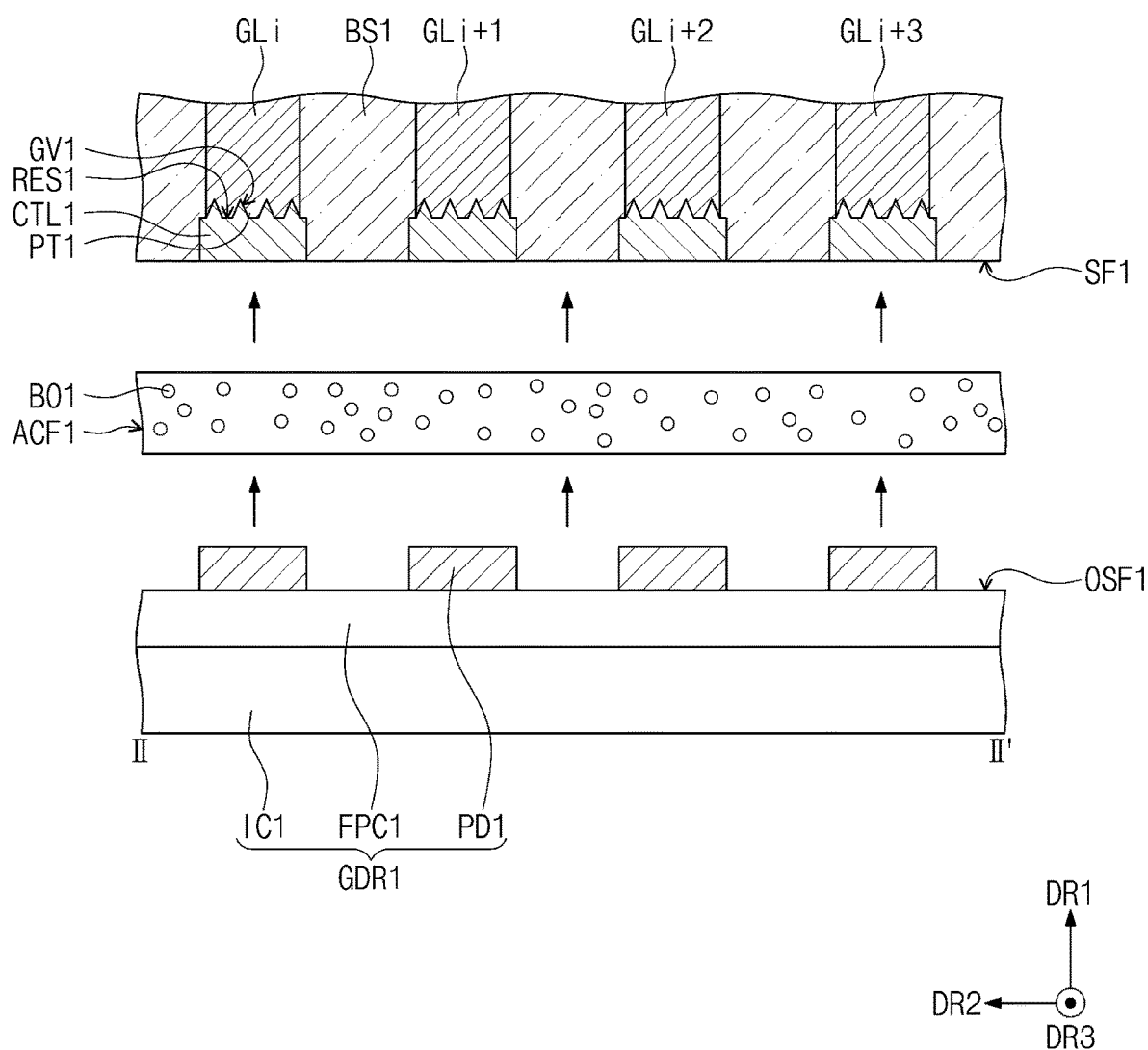

Referring to FIGS. 21 and 22, the first anisotropic conductive film ACF1 may be disposed between the first gate driver GDR1 and the display panel DP. The first gate driver GDR1 may be pressed toward an outer side surface of the display panel DP.

The first gate driver GDR1 may be electrically connected to the display panel DP at the first conductive layers CTL1 thereof, by the first anisotropic conductive film ACF1. In an embodiment, for example, the first pads PD1 of the first gate driver GDR1 may be electrically connected to the display panel DP at the first conductive layers CTL1, by the first anisotropic conductive film ACF1.

In the same manner, the second gate driver GDR2 may be electrically connected to the display panel DP at the first conductive layers CTL1 disposed in the first recessed portions RES1 defined by a laser LAR. In the same manner, the data driver DDR may be electrically connected to the display panel DP at the second conductive layers CTL2 disposed in the second recessed portions RES2 defined by a laser LAR.

According to one or more embodiment, as the ends of signal lines of the display panel DP are processed to have a protruding pattern which contacts the conductive layers of the display panel DP, a respective contact area between the signal lines and the conductive layers may improve.

Also, as the conductive layers are disposed in recesses defined at a side surface of the display panel DP and connected to an external member, the conductive layers of the display panel DP may be minimally exposed to outside the display panel DP.

Although embodiments have been described, the invention is not limited thereto, but various changes and modifications can be made by one ordinary skilled in the art within the spirit and scope of the invention as hereinafter claimed. Thus, to the maximum extent allowed by law, the scope of the invention is to be determined by the broadest permissible interpretation of the following claims and their equivalents, and shall not be restricted or limited by the foregoing detailed description.

What is claimed is:

1. A display device comprising:
    a first substrate comprising a first side surface and a plurality of signal lines which respectively define a plurality of signal line ends, each signal line end among the plurality of signal line ends defines a plurality of protruding portions and a plurality of grooves which are respectively between protruding portions adjacent to each other;
    a second substrate facing the first substrate and comprising a second side surface coplanar with the first side surface;
    a first recess defined recessed from each of the first side surface and the second side surface, the first recess exposing the each signal line end which defines the plurality of protruding portions and the plurality of grooves, to outside the first substrate;
    a first conductive pattern in the first recess; and
    a first driver facing each of the first side surface and the second side surface,
    wherein at the first recess:
        the first conductive pattern is exposed to outside the first substrate and the second substrate, and
        the first driver is electrically connected to the first conductive pattern.

2. The display device of claim 1, wherein the first recess is continuously defined recessed from each of the first side surface of the first substrate and the second side surface of the second substrate.

3. The display device of claim 1, wherein the plurality of signal lines of the first substrate comprises:
    a gate line extending along a first direction and including an end at the first recess;

a data line insulated from the gate line and extending along a second direction crossing the first direction; and a pixel connected to the gate line and the data line, wherein the end of the gate line is electrically connected to the first conductive pattern at the first recess.

4. The display device of claim 3, wherein each of the first recess and the first conductive pattern continuously extends along a third direction crossing each of the first direction and the second direction.

5. The display device of claim 3, wherein each of the first recess, the first conductive pattern and the gate line has a width extended along the second direction, and the width of the first recess and the width of the first conductive pattern are each greater than the width of the gate line.

6. The display device of claim 3, wherein the first driver comprises:
 a first circuit board;
 a first driving chip on the first circuit board; and
 a first pad connected to the first driving chip,
the first circuit board faces each of the first side surface and the second side surface, and
the first pad is electrically connected to the first conductive pattern, at the first recess.

7. The display device of claim 6, further comprising a first anisotropic conductive film which is between the first pad of the first driver and the first conductive pattern which is in the first recess, and electrically connects the first pad and the first conductive pattern to each other.

8. The display device of claim 7, wherein each of the first recess, the first conductive pattern and the first anisotropic conductive film has a width extended along the second direction and a length extended along a third direction crossing each of the first direction and the second direction, and the width and the length of the first anisotropic conductive film is respectively greater than the width and the length of each of the first recess and the first conductive pattern.

9. The display device of claim 3, wherein the first substrate further comprises a fourth side surface; and the second substrate further comprises a fifth side surface coplanar with the fourth side surface;

further comprising:

a second recess defined recessed from each of the fourth side surface and the fifth side surface;

a second conductive pattern in the second recess; and a second driver facing each of the fourth side surface and the fifth side surface, wherein at the second recess:
 the second conductive pattern is exposed to outside the first substrate and the second substrate, and
 the second driver is electrically connected to the second conductive pattern.

10. The display device of claim 9, wherein the second recess is continuously defined recessed from each of the fourth side surface of the first substrate and the fifth side surface of the second substrate.

11. The display device of claim 9, wherein the data line includes an end at the second recess; and
the end of the data line is electrically connected to the second conductive pattern at the second recess.

12. The display device of claim 9, wherein each of the second recess, the second conductive pattern and the data line has a width extended along the first direction, and the width of the second recess and the width of the second conductive pattern are each greater than the width of the data line.

13. The display device of claim 9, wherein the second driver comprises:

a second circuit board;
a second driving chip on the second circuit board; and
a second pad connected to the second driving chip,
wherein
 the second circuit board faces each of the fourth side surface and the fifth side surface, and
 the second pad is electrically connected to the second conductive pattern, at the second recess.

14. The display device of claim 13, further comprising a second anisotropic conductive film which is between the second pad of the second driver and the second conductive pattern which is in the second recess, and electrically connects the second pad and the second conductive pattern to each other, wherein each of the second recess, the second conductive pattern and the second anisotropic conductive film has a width extended along the first direction and a length extended along a third direction crossing each of the first direction and the second direction, and the width and the length of the second anisotropic conductive film is respectively greater than the width and the length of each of the second recess and the second conductive pattern.

15. The display device of claim 1, wherein the first conductive pattern in the first recess extends into the plurality of grooves of the each signal line.

16. The display device of claim 1, wherein the first conductive pattern in the first recess defines an outer surface which is exposed to outside the first substrate and the second substrate, and the outer surface of the first conductive pattern is coplanar with the first surface of the first substrate and the second surface of the second substrate.

17. A method for providing a display device, comprising:
providing a display panel comprising:
 a first substrate comprising a first side surface and a plurality of signal lines which respectively define a plurality of signal line ends, each signal line end among the plurality of signal line ends defines a plurality of protruding portions and a plurality of grooves which are respectively between protruding portions adjacent to each other, and
 a second substrate facing the first substrate and comprising a second side surface coplanar with the first side surface;
providing a first recess defined recessed from each of the first side surface and the second side surface, the first recess exposing the each signal line end which defines the plurality of protruding portions and the plurality of grooves, to outside the first substrate;
providing a first conductive pattern in the first recess;
providing a first driver facing each of the first side surface and the second side surface; and
providing the first driver which faces each of the first side surface and the second side surface, electrically connected to the first conductive pattern.

18. The method of claim 17, wherein
the first substrate further comprises a fourth side surface; and
the second substrate further comprises a fifth side surface coplanar with the fourth side surface;
further comprising:
providing a second recess defined recessed from each of the fourth side surface and the fifth side surface;
providing a second conductive pattern in the second recess;
providing a second driver facing each of the fourth side surface and the fifth side surface; and
providing the second driver which faces each of the fourth side surface and the fifth side surface, electrically connected to the second conductive pattern.

19. The method of claim 18, wherein the plurality of signal lines of the first substrate comprises:
a gate line extending along a first direction and including an end at the first recess;
a data line insulated from the gate line and extending along a second direction crossing the first direction, the data line including an end at the second recess; and
a pixel connected to the gate line and the data line, wherein
the end of the gate line is electrically connected to the first conductive pattern at the first recess, and
the end of the data line is electrically connected to the second conductive pattern at the second recess.

* * * * *